US008121213B2

(12) United States Patent
Ota et al.

(10) Patent No.: US 8,121,213 B2
(45) Date of Patent: Feb. 21, 2012

(54) MODULATION DEVICE, DEMODULATION DEVICE, MODULATION METHOD AND DEMODULATION METHOD

(75) Inventors: Genichiro Ota, Miura (JP); Daichi Imamura, Yokosuka (JP); Keiji Takakusaki, Yokohama (JP); Mitsuru Uesugi, Yokosuka (JP)

(73) Assignee: Panasonic Corporation, Osaka (JP)

( * ) Notice: Subject to any disclaimer, the term of this patent is extended or adjusted under 35 U.S.C. 154(b) by 1055 days.

(21) Appl. No.: 10/565,380

(22) PCT Filed: Jul. 26, 2004

(86) PCT No.: PCT/JP2004/010985
§ 371 (c)(1),
(2), (4) Date: Jan. 23, 2006

(87) PCT Pub. No.: WO2005/011223
PCT Pub. Date: Feb. 3, 2005

(65) Prior Publication Data
US 2006/0245514 A1    Nov. 2, 2006

(30) Foreign Application Priority Data

Jul. 25, 2003 (JP) ................................. 2003-280519
Nov. 12, 2003 (JP) ................................. 2003-382324
Apr. 19, 2004 (JP) ................................. 2004-151056

(51) Int. Cl.
*H03C 1/52* (2006.01)
(52) U.S. Cl. ......... 375/270; 375/301; 375/321; 375/268
(58) Field of Classification Search .................. 375/270, 375/301, 321, 268, 267
See application file for complete search history.

(56) References Cited

U.S. PATENT DOCUMENTS

| 3,628,155 | A  | * | 12/1971 | Muzzi ......................... 455/306 |
| 4,835,791 | A  |   | 5/1989  | Daoud |
| 4,866,521 | A  | * | 9/1989  | Hurst, Jr. ................... 348/436.1 |
| 5,477,199 | A  | * | 12/1995 | Montreuil ..................... 332/103 |
| 5,920,840 | A  |   | 7/1999  | Satyamurti et al. |
| 6,091,781 | A  |   | 7/2000  | Mujtaba |
| 6,628,735 | B1 | * | 9/2003  | Belotserkovsky et al. ... 375/355 |
| 7,016,659 | B1 | * | 3/2006  | Dorrough et al. ............ 455/108 |
| 2003/0092406 | A1 |  | 5/2003  | Ito et al. |

FOREIGN PATENT DOCUMENTS

| JP | 2215242    | 8/1990  |
| JP | 9-294115   | 11/1997 |
| JP | 11501405   | 2/1999  |
| JP | 11239189   | 8/1999  |
| JP | 2003134069 | 5/2003  |

(Continued)

OTHER PUBLICATIONS

PCT International Search Report dated Nov. 9, 2004.

(Continued)

*Primary Examiner* — Kabir A Timory
(74) *Attorney, Agent, or Firm* — Dickinson Wright PLLC

(57) ABSTRACT

A modulation apparatus is disclosed that enables significant improvements in signal transmission rate in a limited frequency band as compared with conventional modulation schemes. The modulation apparatus has first and second frequency-increasing single side band (SSB) modulators. The modulators are configured to have respective carrier frequencies with a difference by a frequency corresponding to the symbol frequency (i.e. fundamental frequency of the input symbol). An adder combines a lower side band (LSB) signal obtained from the SSB modulator set for a higher carrier frequency, and an upper side band (USB) signal obtained from the SSB modulator set for a lower carrier frequency to obtain a modulation signal.

8 Claims, 23 Drawing Sheets

OTHER PUBLICATIONS

S. A. Mujtaba: "A Novel Scheme for Transmitting QPSK as a Single-Sideband Signal," 0/7803-4984-9/98/$10.00, 1998, IEEE, pp. 592-597.

Office Action in the corresponding Japanese Patent Application dated Feb. 16, 2010.

Supplementary European Search Report dated Feb. 12, 2010.

G. Ohta, et al., "Considerations on New Modulation Methods for Spectram Efficiency," Technical Report of IEICE, vol. 103, No. 459, Nov. 2003, p. 189-194.

\* cited by examiner

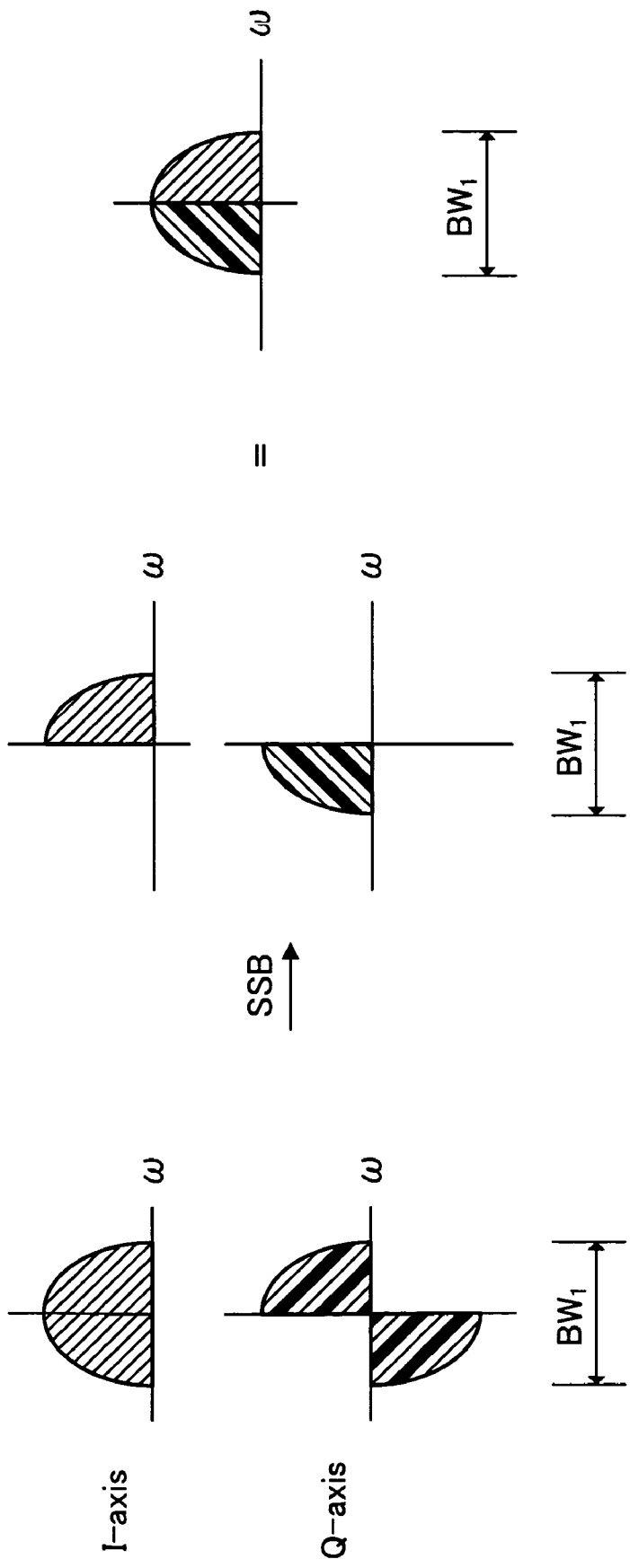

FIG.8A  $u(t)(=v_{even}(t)+v_{odd}(t))$
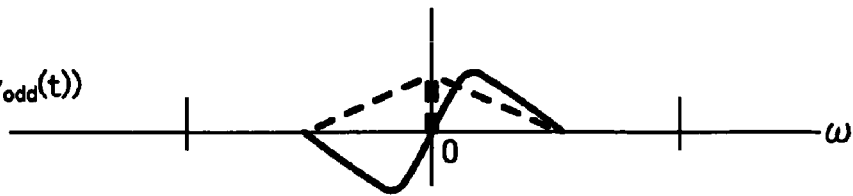
FIG.8B  $H[u(t)](=j \cdot u'(t))$
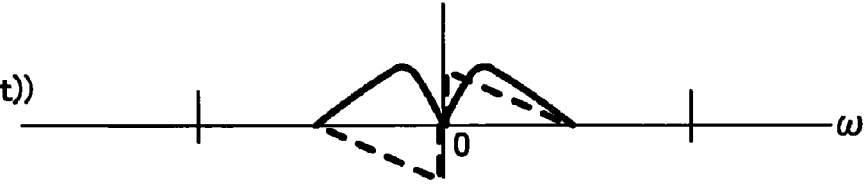
FIG.8C  $u(t) \times \cos\omega_1 t$
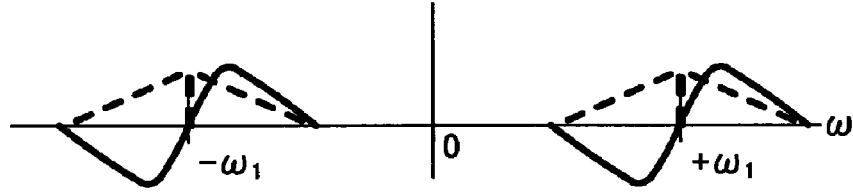
FIG.8D  $u'(t) \times \sin\omega_1 t$
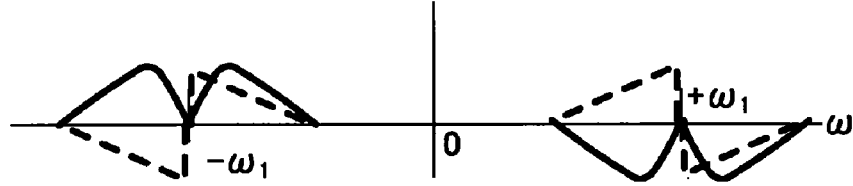
FIG.8E  SSB (USB)= $u(t) \times \cos\omega_1 t - u'(t) \times \sin\omega_1 t$
FIG.8F  SSB (LSB)= $u(t) \times \cos\omega_1 t + u'(t) \times \sin\omega_1 t$
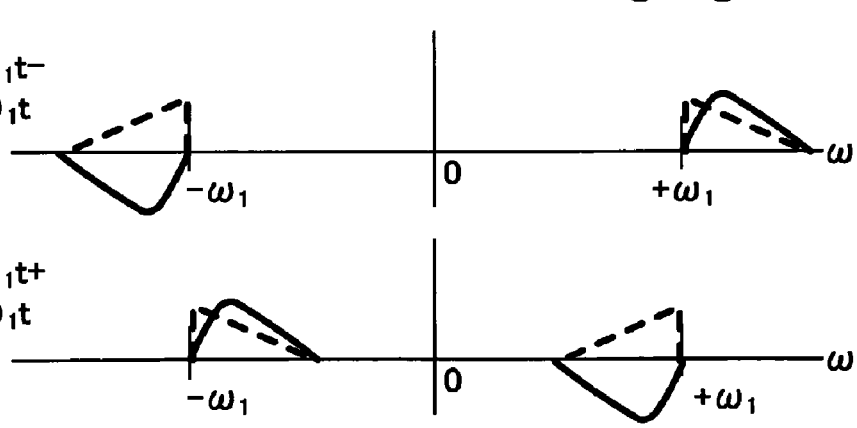
FIG.9A  $v_{even}(t)$
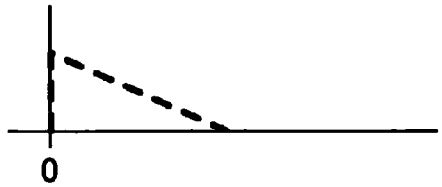
FIG.9B  $v_{odd}(t)$
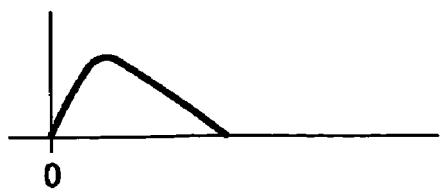

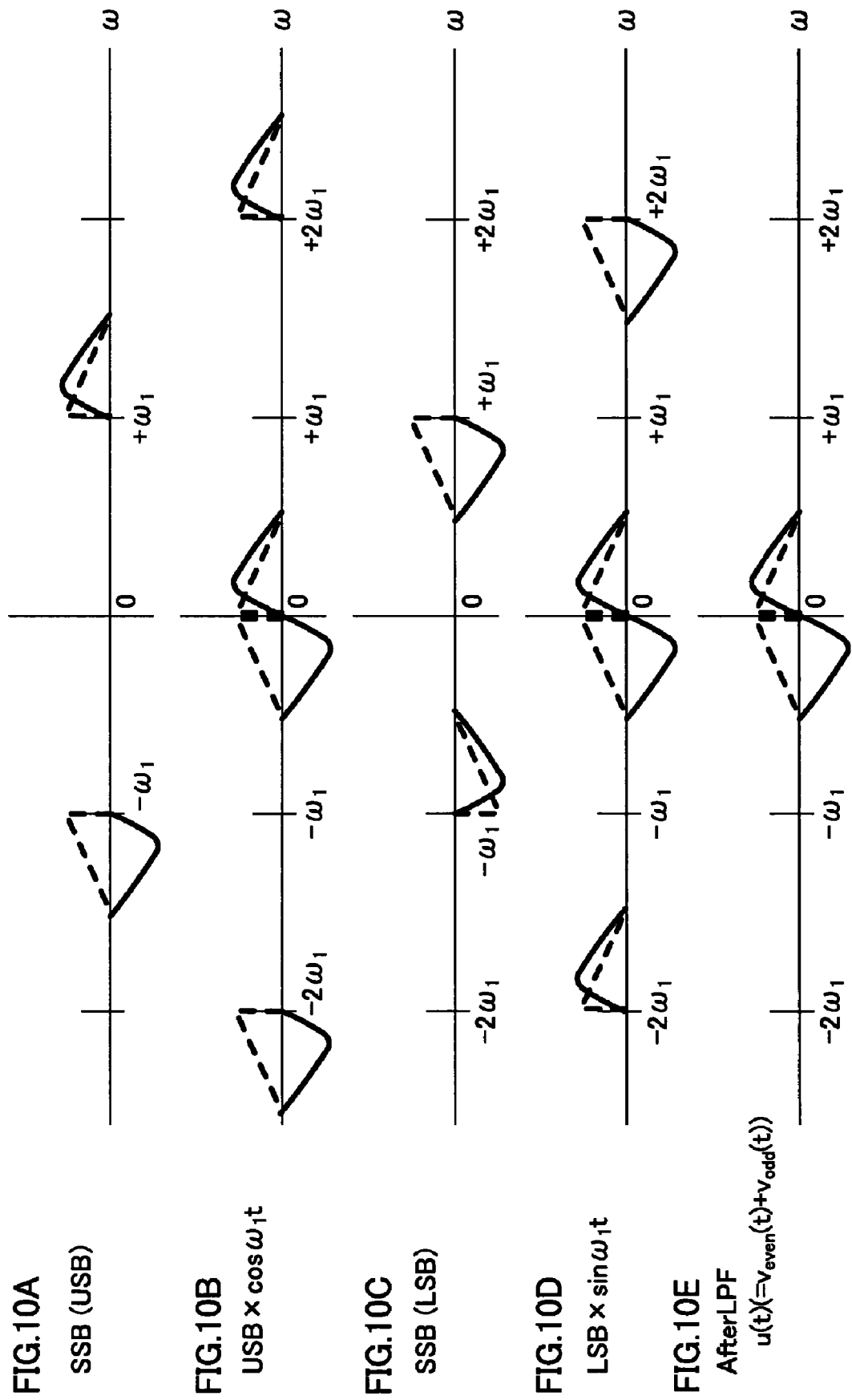

FIG.17A  LSB
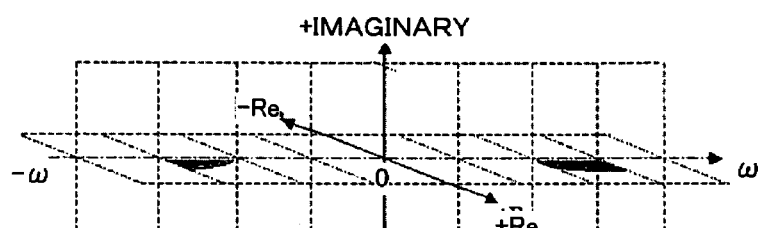
FIG.17B  USB
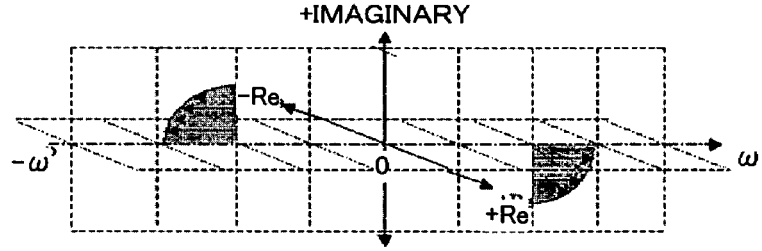
FIG.17C  LSB + USB
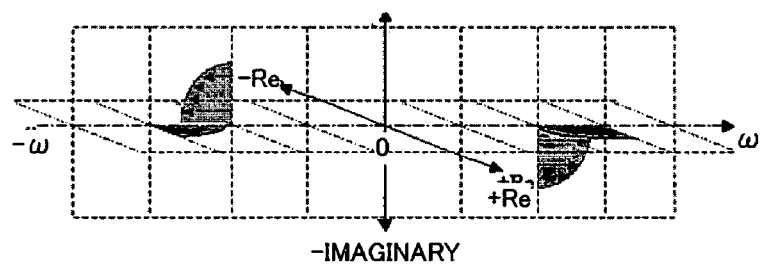

MODULATION DEVICE, DEMODULATION DEVICE, MODULATION METHOD AND DEMODULATION METHOD

TECHNICAL FIELD

The present invention relates to a modulation apparatus, demodulation apparatus, modulation method and demodulation method using SSB (Single Side Band) technique.

BACKGROUND ART

In recent years, with the widespread use of information processing technology and the rapid progression of the so-called IT (Information Technology) introduced society, the expansion and demand has been remarkable in information communications. For the communication infrastructure, introduction of wireless and high-speed communications is desired naturally to connect among the society, and further connect between a person and the society. Such increasing demand for mobile communications will exhaust abundant frequency resources.

Currently, a main subject under study to enhance the spectral efficiency is improvements in technology relating to radio propagation as typified by MIMO (Multi Input Multi Output). However, there are various difficulties in reserving a desired radio communication path in free space, especially space in outdoor environments. Particularly, more difficulties arise under circumstances where terminals move at high speed. Multiplexing is further difficult.

In view of the foregoing, it is considered that reliable improvement should be first established in baseband. With respect to improvements in baseband, pioneers have been developing successively new schemes such as ASK, PSK, QAM, CDMA and OFDM. Thus, as an essential resolving method, improvements in modulation efficiency in baseband are desired earnestly.

First, considering a signal density in doubling a signal rate is as shown in FIG. 1B. In addition, FIG. 1A shows a Nyquist signal waveform on one axis, and one wave of Nyquist signal is configured every symbol duration T. FIG. 1B shows the case where two waves of Nyquist signal are accommodated within the symbol duration T, and the transmission rate is doubled. However, when two waves of Nyquist signal are accommodated simply within the symbol duration T as shown in FIG. 1B, a frequency band is broadened by two times as compared with the case as shown in FIG. 1A, thus being not preferable.

Conventionally, it is known that a SSB (Single Side Band) scheme is resistant to variations in propagation environments except that some device is required for carrier reproduction in a reception system. The technique to improve the bit error rate characteristic by applying the SSB scheme is described in U.S. Pat. No. 6,091,781 (JP H01-239189), for example.

FIGS. 2A, 2B and 2C illustrate the principle described in the above document. By applying the SSB scheme to a basic I-axis signal and Q-axis signal as shown in FIG. 2A, an I-axis signal and Q-axis signal provided with the SSB scheme as shown in FIG. 2B are obtained and combined in order to form a SSB-QPSK signal as shown in FIG. 2C.

This processing is specifically implemented by a circuit configuration as shown in FIG. 3. First, interpolators 1 and 2 interpolate zero respectively to an in-phase data signal X(n) and quadrature data signal Y(n). An output of interpolator 1 is output to signal combiner 7 via delay circuit 3, while being output to signal combiner 8 after undergoing Hilbert transform by Hilbert filter 4. An output of interpolator 2 undergoes Hilbert transform by Hilbert filter 5 and then is output to signal combiner 7, while being output to signal combiner 8 via delay circuit 6. An output of signal combiner 7 is provided to mixer 11 via pulse shaping filter 9, and an output of signal combiner 8 is provided to mixer 12 via pulse shaping filter 10. Mixer 11 modulates cosine carrier $\cos(\omega_c t)$ with the output signal of pulse shaping mixer 9, and mixer 12 modulates sine carrier $\sin(\omega_c t)$ with the output signal of pulse shaping mixer 10. An I-channel RF signal and Q-channel RF signal respectively from mixers 11 and 12 are combined in signal combiner 13, and SSB-QPSK signal Z(t) is thereby obtained. Thus, according to the configuration as described in the above-mentioned document, to apply the SSB scheme, respective Hilbert transform components of an I-axis signal and Q-axis signal are generated and subjected to quadrature modulation.

By this means, according to the above-mentioned document, the SSB scheme resolves the conventional defect that the I-axis signal and Q-axis signal are uniquely undergone cosine multiplication and sine multiplication, and enables improvements in transmission characteristics. It is thus described in the above-mentioned document that SSB-QPSK theoretically has the spectral efficiency (for example, 2 bps/Hz) equal to that in QPSK and SSB, and is more resistant to equaling inadequacy on a Rayleigh fading path than QPSK and SSB, and that changes in envelop in SSB-QPSK is less than that in QPSK by 6 dB.

However, the technique as described in the above-mentioned document is to improve the bit error rate characteristic by applying the SSB scheme, and is fundamentally not to enable greatly increased signal transmissions in a limited frequency band as compared with the conventional technique.

DISCLOSURE OF INVENTION

It is an object of the present invention to provide a modulation apparatus, demodulation apparatus, modulation method and demodulation method enabling great improvements in signal transmission rate in a limited frequency band as compared with the conventional modulation system.

The object is achieved by comprising a first frequency-increasing SSB modulator that performs SSB modulation on a first input symbol to obtain a USB signal, a second frequency-increasing SSB modulator that performs SSB modulation on a second input symbol to obtain a LSB signal, and a combiner that combines the USB signal and the LSB signal, where the second frequency-increasing SSB modulator performs SSB modulation using a carrier frequency higher than a carrier frequency used in the first frequency-increasing SSB modulator by the fundamental frequency of the input symbol.

BRIEF DESCRIPTION OF DRAWINGS

FIG. 2A is a diagram illustrating an I-axis signal and Q-axis signal as origins to apply SSB;

FIG. 2B is a diagram illustrating SSB-applied I-axis signal and Q-axis signal;

FIG. 2C is a diagram illustrating a SSB-QPSK signal;

FIG. 8A is a diagram illustrating spectra of an input signal u(t) indicated by combining an even function Veven(t) and odd function Vodd(t);

FIG. 8B is a diagram illustrating a Hilbert transform output of the input signal u(t) using the even function Veven(t) and odd function Vodd(t) that are components of the input signal u(t);

FIG. 8C is a diagram illustrating a resultant signal of multiplication of the input signal u(t) by cos $\omega_1 t$;

FIG. 8D is a diagram illustrating a resultant signal of multiplication of u'(t) resulting from Hilbert transform on the input signal u(t) by sin $\omega_1 t$;

FIG. 8E is a diagram illustrating the difference between the signal as shown in FIG. 8C and the signal as shown in FIG. 8D;

FIG. 8F is a diagram illustrating the sum of the signal as shown in FIG. 8C and the signal as shown in FIG. 8D;

FIG. 9A is a diagram illustrating the even function component;

FIG. 9B is a diagram illustrating the odd function component;

FIG. 10A is a diagram illustrating a USB signal;

FIG. 10B is a diagram illustrating a resultant signal of multiplication of the USB signal by cos $\omega_1 t$;

FIG. 10C is a diagram illustrating a LSB signal;

FIG. 10D is a diagram illustrating a resultant signal of multiplication of the LSB signal by sin $\omega_1 t$;

FIG. 10E is a diagram illustrating an output of a low-pass filter (demodulation signal);

FIG. 17A is a diagram illustrating spectra in frequency complex space of the LSB signal obtained in Embodiment 1;

FIG. 17B is a diagram illustrating spectra in frequency complex space of the USB signal obtained in Embodiment 1;

FIG. 17C is a diagram illustrating spectra in frequency complex space of the SSB-multiplexed modulation signal obtained in Embodiment 1;

BEST MODE FOR CARRYING OUT THE INVENTION

It is a gist of the invention modulating an information signal with a high symbol rate two times (Embodiment 1) or four times (Embodiment 2) as much as that in conventional quadrature modulation. When such operation is performed, the required frequency bandwidth is generally increased by two times or four times. The invention is aimed at performing SSB-multiplexing on a transmission signal to accommodate within an original frequency bandwidth. Further, the invention proposes a demodulation scheme for such a modulation signal.

Embodiments of the present invention will specifically be described below with reference to accompanying drawings.

Embodiment 1

Figures 1A, 1B:
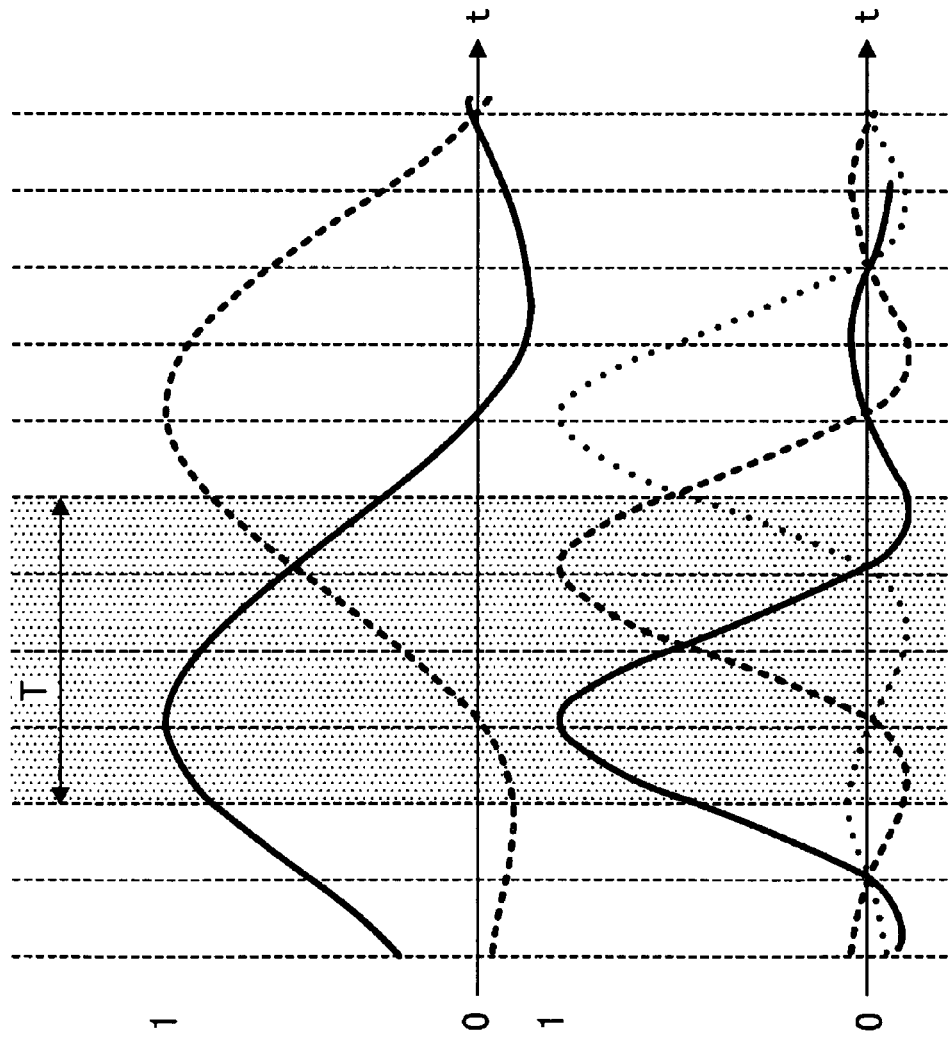
FIG. 1A is a diagram illustrating a state where one wave of Nyquist signal is configured in symbol duration.
FIG. 1B is a diagram illustrating a state where two waves of Nyquist signal are configured in symbol duration.
Figure 3:
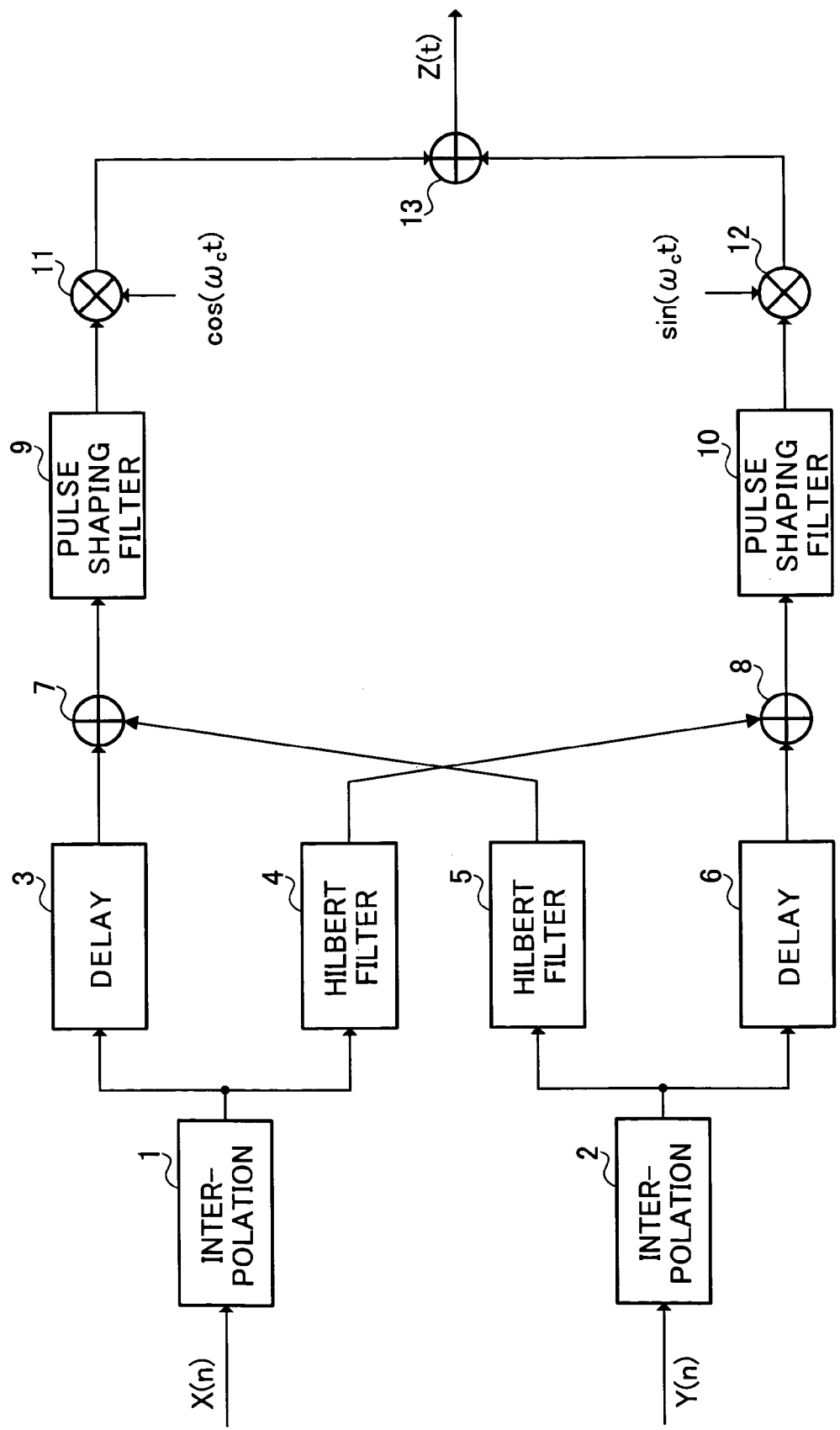
FIG. 3 is a block diagram illustrating a configuration of a conventional modulation apparatus.
Figure 4:
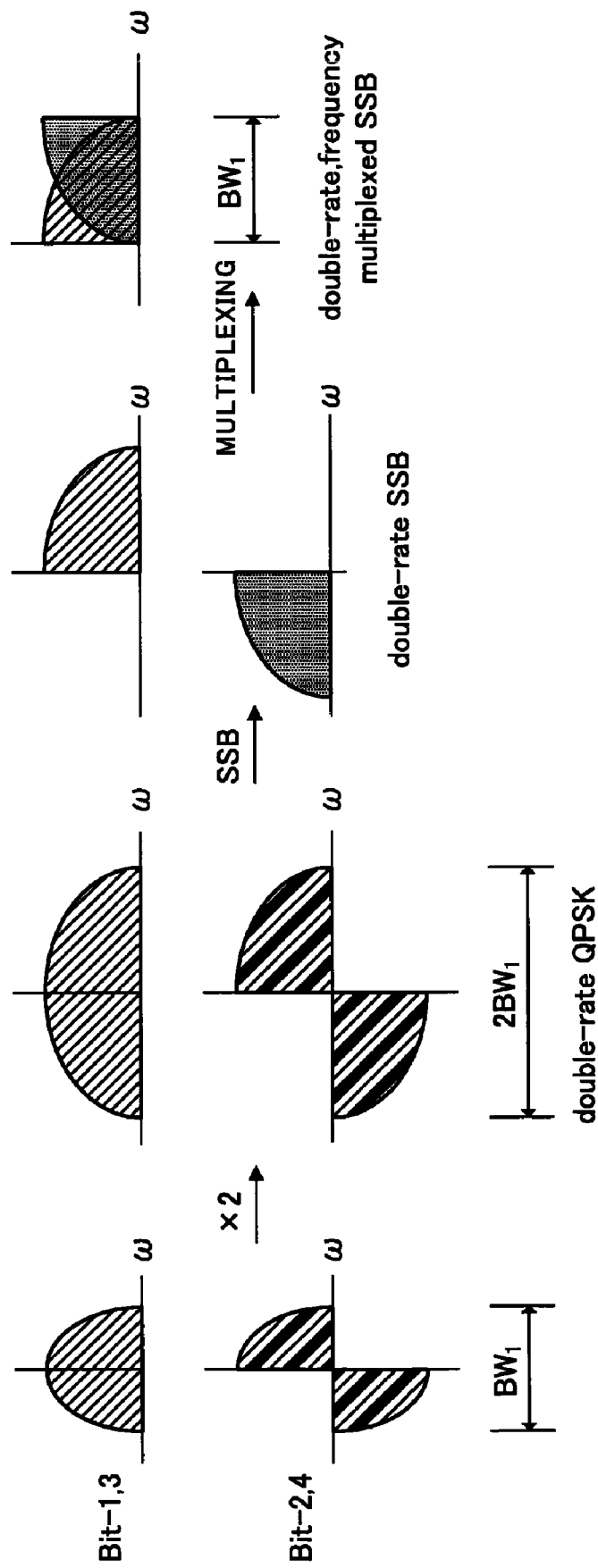
FIG. 4A is a diagram illustrating spectra of an I-axis signal and Q-axis signal of a general QPSK signal.
FIG. 4B is a diagram illustrating spreading of a frequency bandwidth when a signal transmission rate is doubled.
FIG. 4C is a diagram illustrating application of SSB to the I-axis signal and Q-axis signal in an Embodiment.
FIG. 4D is a diagram illustrating multiplexing of SSB-applied signals in the Embodiment.

FIGS. 4A to 4D illustrate the concept of the modulation scheme of the invention. FIG. 4A illustrates spectra on the I axis and Q axis according to a conventional basic QPSK scheme. In order to improve double the transmission rate of the conventional QPSK scheme, frequency bandwidth $BW_1$ should be doubled as shown in FIG. 4B, however the spectral efficiency is not improved. Therefore, in this embodiment, the SSB scheme is performed on the I-axis signal and Q-axis signal, each side bandwidth is thereby expanded to the whole frequency bandwidth $BW_1$ that is two times the original side band (FIG. 4C), and each side band is multiplexed in the same frequencies (FIG. 4D). It is thus possible to implement communications with the double transmission rate while keeping the given frequency bandwidth. In other words, the transmission rate can be doubled as compared with SSB-QPSK described in Background Art as described above.

Figure 5:
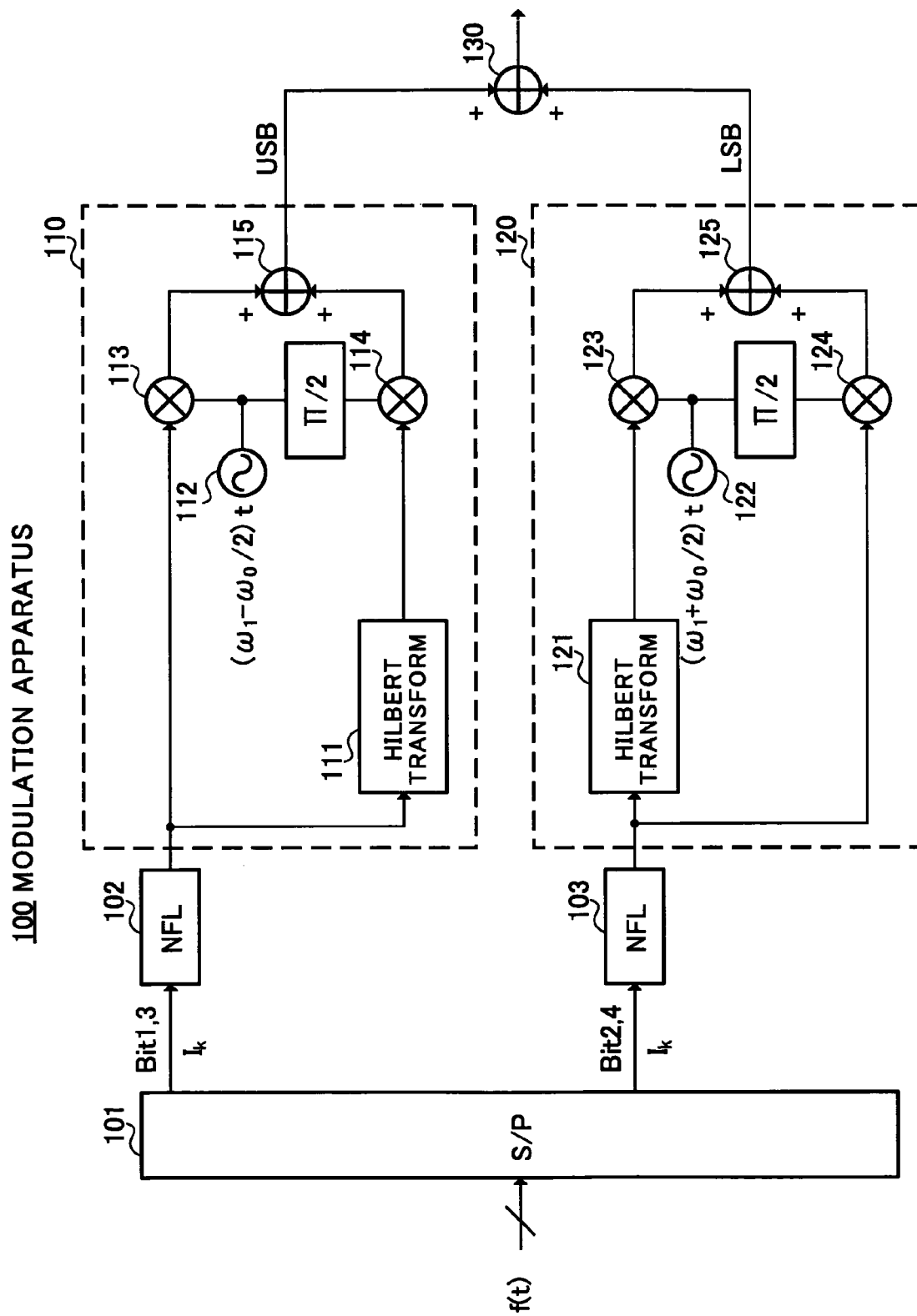
FIG. 5 is a block diagram illustrating a configuration of a modulation apparatus in Embodiment 1.

FIG. 5 illustrates a configuration to implement the concept of this Embodiment as shown in FIGS. 4A to 4D. In modulation apparatus 100 of this Embodiment as shown in FIG. 5, a signal f(t) to transmit is transformed into two-sequence parallel signals in serial-parallel transformer (S/P) 101. Since the signal rate can be twice as high as the conventional signal rate, the signal groups are referred to as Bit1, 3 and Bi2, 4. The two-sequence signals are converted into Nyquist signals respectively in Nyquist filters (NFL) 102 and 103.

A Nyquist signal output from Nyquist filter 102 is input to frequency-increasing SSB modulator 110, while a Nyquist signal output from Nyquist filter 103 is input to frequency-increasing SSB modulator 120. Frequency-increasing SSB modulator 110 has a quadrature modulation section comprised of frequency signal source 112 and multipliers 113 and 114, and Hilbert transformer 111. Frequency-increasing SSB modulator 120 has a quadrature modulation section comprised of frequency signal source 122 and multipliers 123 and 124, and Hilbert transformer 121.

Multiplier 113 multiplies the Nyquist signal of Bit1, 3 input to frequency-increasing SSB modulator 110 by a cosine curve, from frequency signal source 112, with frequency $\omega_1-\omega_0/2$ obtained by subtracting a half the symbol frequency $\omega_0$ from carrier frequency $\omega_1$. At the same time, multiplier 114 multiplies a signal obtained by passing the Nyquist signal of Bit1, 3 through Hilbert transformer 111 by a sine curve with the frequency $\omega_1-\omega_0/2$ from frequency signal source 112. Adder 115 calculates the sum of these two outputs, and an upper SSB signal (USB signal) is obtained which conveys the signal Bit1, 3 and has the carrier frequency $\omega_1-\omega_0/2$.

Meanwhile, multiplier 124 multiplies the Nyquist signal of Bit2, 4 input to frequency-increasing SSB modulator 120 by a cosine curve, from frequency signal source 122, with frequency $\omega_1+\omega_0/2$ obtained by adding a half the symbol frequency $\omega_0$ to carrier frequency $\omega_1$. At the same time, multiplier 123 multiplies a signal obtained by passing the Nyquist signal of Bit2, 4 through Hilbert transformer 121 by a sine curve with the frequency $\omega_1+\omega_0/2$ from frequency signal source 122. Adder 125 calculates the sum of these two outputs, and a lower SSB signal (LSB signal) is obtained which conveys the signal Bit2, 4 and has the carrier frequency $\omega_1+\omega_0/2$.

Figure 6C:
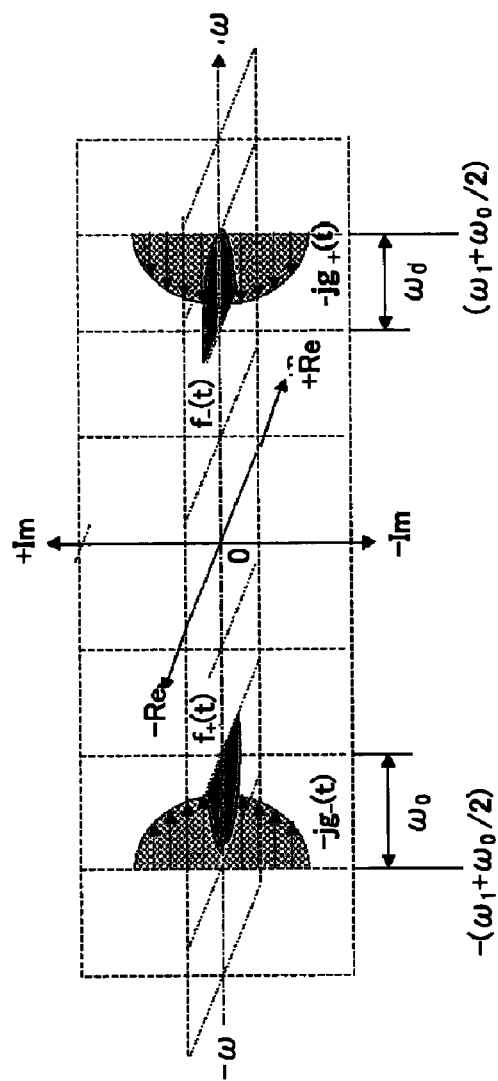
FIG. 6C is a diagram illustrating a SSB-multiplexed modulation signal obtained by the modulation apparatus of the Embodiment.
Figure 6B:
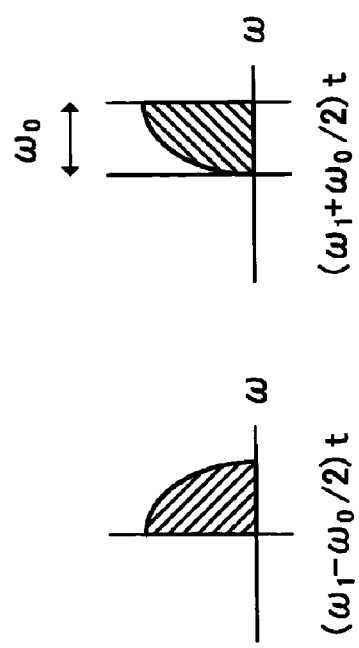
FIG. 6B is a diagram illustrating a LSB signal obtained by the modulation apparatus of the Embodiment.
Figure 6A:
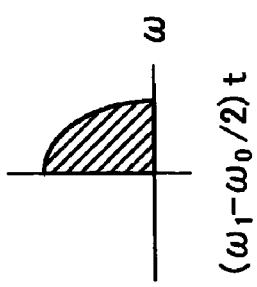
FIG. 6A is a diagram illustrating a USB signal obtained by the modulation apparatus of the Embodiment.

Then, signal combiner 130 combines the USB signal (see FIG. 6A) output from frequency-increasing SSB modulator 110 and the LSB signal (FIG. 6B) output from frequency-increasing SSB modulator 120, thereby obtaining a SSB-multiplexed modulation signal as shown in FIG. 6C.

Thus, in this Embodiment, frequency-increasing SSB modulator 120 to obtain a LSB signal performs SSB modulation using a carrier frequency higher than a carrier frequency used in frequency-increasing SSB modulator 110 to obtain a USB signal by the fundamental frequency of an input symbol. It is thereby possible to multiplex the LSB signal and USB signal in the same frequency bandwidth.

Figure 7:
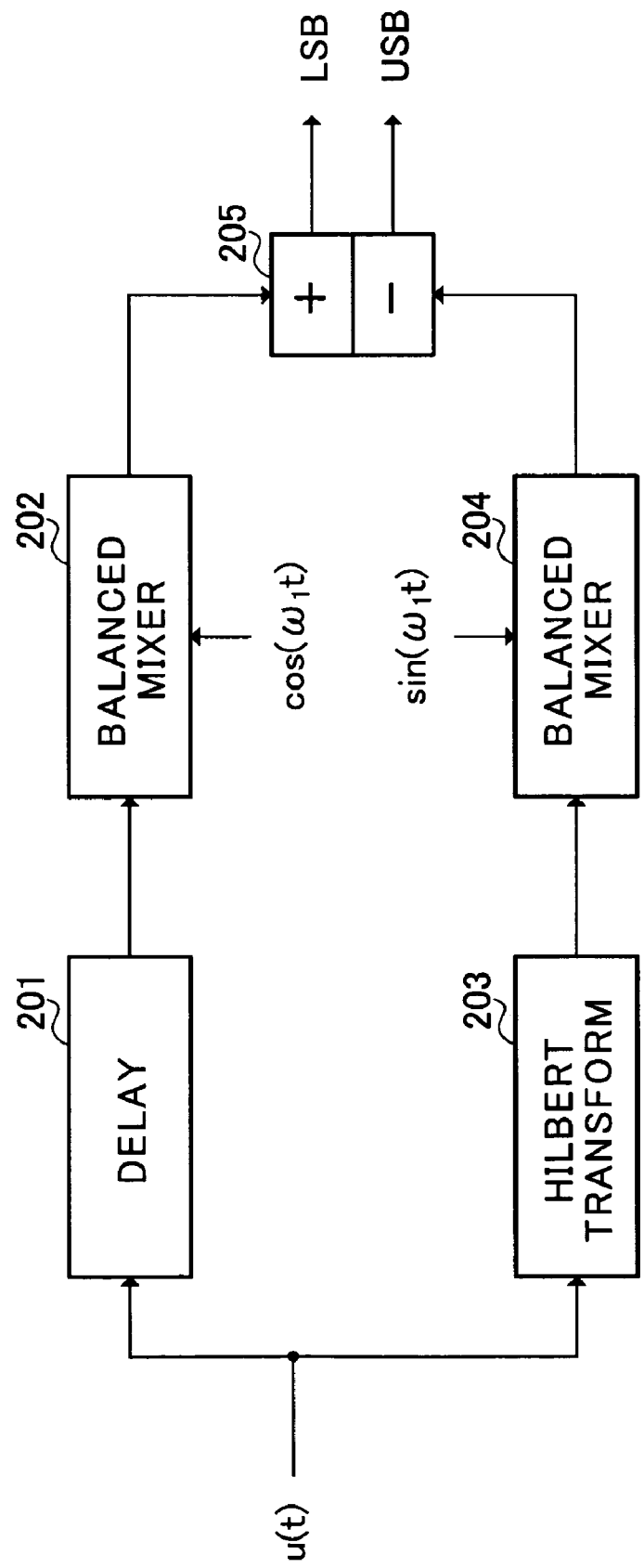
FIG. 7 is a block diagram illustrating a configuration of a phase-shift type SSB modulator.

For understanding of this Embodiment, described below is a general phase-shift type SSB modulator as shown in FIG. 7. FIGS. 8A to 8F illustrate by spectrum the operation of phase-shift type SSB modulator 200 as shown in FIG. 7. When a complex analytic function as in the following equation is taken as a modulation signal function, it is possible to obtain a SSB signal:

$$f(t)=u(t)+ju'(t) \quad (1)$$

In Eq. (1), $u'(t)$ represents Hilbert transform of input signal $u(t)$.

As expressed in following equations, an upper circuit (delay circuit 201 and balanced mixer 202) in FIG. 7 multiplies the input signal $u(t)$ by carrier $\cos \omega_1 t$, and a lower circuit (Hilbert transformer 203 and balanced mixer 204) in FIG. 7 multiplies the signal $u'(t)$ obtained by performing Hilbert transform on the input signal $u(t)$ by carrier $\sin \omega_1 t$.

$$u(t) \times \cos\omega_1 t = u(t) \times \frac{1}{2}(e^{j\omega_1 t} + e^{-j\omega_1 t}) \quad (2)$$

$$u'(t) \times \sin\omega_1 t = u'(t) \times \frac{1}{j2}(e^{j\omega_1 t} + e^{-j\omega_1 t})$$

FIG. 8A is a diagram illustrating spectra of the input signal $u(t)$ indicated by combining an even function Veven(t) and odd function Vodd(t). FIG. 8B is a diagram illustrating a Hilbert transform output of the input signal $u(t)$ using the even function Veven(t) and odd function Vodd(t) that are components of the input signal $u(t)$. FIG. 8C is a diagram illustrating a resultant signal of multiplication of the input signal $u(t)$ by $\cos \omega_1 t$. FIG. 8D is a diagram illustrating a resultant signal of multiplication of $u'(t)$ resulting from Hilbert transform on the input signal $u(t)$ by $\sin \omega_1 t$. These resultants are subjected to combining (herein, subtraction) as expressed in the following equation.

$$u(t) \times \cos\omega_1 t - u'(t) \times \sin\omega_1 t = \quad (3)$$

$$u(t) \times \frac{e^{j\omega_1 t} + e^{-j\omega_1 t}}{2} - ju'(t) \times \frac{e^{j\omega_1 t} + e^{-j\omega_1 t}}{2} =$$

$$\frac{1}{2}\{(u(t) - ju'(t))e^{j\omega_1 t} + (u(t) - ju'(t))e^{-j\omega_1 t}\} =$$

$$\frac{1}{2}\{f(t)e^{j\omega_1 t} + f'(t)e^{-j\omega_1 t}\}$$

As can be seen from the result of Eq. (3), the signal $f(t)$ to modulate is multiplexed on an analytic signal $e^{j\omega_1 t}$ due to the carrier frequency $\omega_1$, and a signal multiplexed on an analytic signal $e^{-j\omega_1 t}$ due to the carrier frequency $-\omega_1$ paired in a positive frequency domain is $f^*(t)$ that is a conjugate number of $f(t)$. In other words, it is proved that the spectra are positive-negative symmetry (line symmetry) on the frequency axis and thus SSB is made. FIG. 8E shows the difference between the spectra and thus illustrates generation of USB (upper side band SSB), while FIG. 8F shows the sum of the spectra and thus illustrates generation of LSB (lower side band SSB).

Herein, FIG. 8E shows USB obtained from FIGS. 8C-8D, while FIG. 8F shows LSB obtained from FIGS. 8C+8D. Further, in FIGS. 8A to 8F, it is assumed that the triangular mark as shown in FIG. 9A represents the even function component, while the bracket mark as shown in FIG. 9B represents the odd function component.

Described below is generation of USB and LSB that can be superimposed on the same frequency required in this Embodiment.

SSB signal $S_{SSB}(t)$ with carrier frequency w, is as expressed below, where m(t) represents an original signal to be modulated, and f(t) represents an analytic signal generated from m(t). $f^*(t)$ and f(t) are signals of complex conjugate numbers. Representing the numbers by m(t) and m'(t) results in $m_+(t)$ for f(t) and $m_-(t)$ for $f^*(t)$. When Hilbert transform is represented by H[ ] and m(t) is regular, analytic signals are defined such that $f(t)=m_+(t)=m(t)+jH[m(t)]$ and $f^*(t)=m_-(t)=m(t)-jH[m(t)]$. Further, $H[m(t)]=-jm(t)$ generally holds.

Thus, the USB signal is expressed by the following equation by definition of SSB as described previously.

$$s_{USB}(t) = f^*(t)e^{j\omega_1 t} + f(t)e^{-j\omega_1 t} \quad (4)$$

$$= m_-(t)e^{j\omega_1 t} + m_+(t)e^{-j\omega_1 t}$$

$$= \{m(t) - jH[m(t)]\}e^{j\omega_1 t} + \{m(t) + jH[m(t)]\}e^{-j\omega_1 t}$$

$$= m(t)(e^{j\omega_1 t} + e^{-j\omega_1 t}) - jH[m(t)](e^{j\omega_1 t} + e^{-j\omega_1 t})$$

$$= 2m(t)\cos\omega_1 t + 2H[m(t)]\sin\omega_1 t$$

The LSB signal orthogonal to USB will be described below with reference to FIG. 6C. FIG. 6C illustrates a conceptual diagram of SSB-QPSK in a complex frequency domain, and USB is configured in an actual plane, while LSB is configured in an imaginary-axis plane. To orthogonally configure USB and LSB in the same band, one should be configured in imaginary-axis space. In FIG. 6C, USB is configured on the real axis, while LSB is configured on the imaginary axis. Configuring in the imaginary-axis space is enabled by multiplying an imaginary number, herein, j. Further, in order that a rotation direction of the analytic signal in phase space is opposite to that of USB, it is necessary to invert a combination of $e^{j\omega_1 t}$ and $e^{-j\omega_1 t}$ of modulation frequency and analytic signals f(t) and f*(t) to those of USB. Accordingly, the equation to implement is as follows:

$$s_{LSB}(t) = -jf(t)e^{j\omega_1 t} + jf^*(t)e^{-j\omega_1 t} \quad (5)$$
$$= H[f(t)]e^{j\omega_1 t} - H[f^*(t)]e^{-j\omega_1 t}$$
$$= -jm_+(t)e^{j\omega_1 t} + jm_-(t)e^{-j\omega_1 t}$$
$$= -j\{m(t) + jH[m(t)]\}e^{j\omega_1 t} + j\{m(t) - jH[m(t)]\}e^{-j\omega_1 t}$$
$$= H[m(t)](e^{j\omega_1 t} + e^{-j\omega_1 t}) - jm(t)(e^{j\omega_1 t} + e^{-j\omega_1 t})$$
$$= 2H[m(t)]\cos\omega_1 t + 2m(t)\sin\omega_1 t$$

Next, using the above equation, to multiplex USB and LSB in the same frequency band, the frequency of USB is decreased by $\omega_0/2$, and the frequency of LSB is increased by $\omega_0/2$. Then, the USB signal is expressed by the following equation:

$$s_{USB}(t) = m_+(t)e^{j(\omega_1 - \frac{\omega_0}{2})t} + m_-(t)e^{-j(\omega_1 - \frac{\omega_0}{2})t} \quad (6)$$
$$= m(t)\cos(\omega_1 - \frac{\omega_0}{2})t + H[m(T)]\sin(\omega_1 - \frac{\omega_0}{2})t$$

The LSB signal is expressed by the following equation:

$$s_{LSB}(t) = -jm_+(t)e^{j(\omega_1 + \frac{\omega_0}{2})t} + -jm_-(t)e^{-j(\omega_1 + \frac{\omega_0}{2})t} \quad (7)$$
$$= H[m(t)]\cos(\omega_1 - \frac{\omega_0}{2})t + m(t)\sin(\omega_1 + \frac{\omega_0}{2})t$$

Herein, assuming that two inputs of orthogonalized SSB signals are $m_1(t)$ and $m_2(t)$, their analytic signals $m_{1+}(t)$, $m_{1-}(t)$, $m_{2+}(t)$, and $m_{2-}(t)$ are expressed in following equations:

$$m_{1+}(t) = m_1(t) + jH[m_1(t)]$$
$$m_{1-}(t) = m_1(t) - jH[m_1(t)]$$
$$m_{2+}(t) = m_2(t) + jH[m_2(t)]$$
$$m_{2-}(t) = m_2(t) - jH[m_2(t)] \quad (8)$$

Then, orthogonalized SSB signal $S_{SSB-QPSK}(t)$ with $m_1(t)$ and $m_2(t)$ respectively as USB and LSB is expressed in the following equation:

$$s_{SSB-QPSK}(t) = \{m_{1-}(t)e^{j(\omega_1 - \frac{\omega_0}{2})t} + m_{1+}(t)e^{-j(\omega_1 - \frac{\omega_0}{2})t}\} - \quad (9)$$
$$j\{m_{2+}(t)e^{j(\omega_1 + \frac{\omega_0}{2})t} + m_{2-}(t)e^{-j(\omega_1 + \frac{\omega_0}{2})t}\}$$

$$= m_1(t)\cos(\omega_1 - \frac{\omega_0}{2})t + H[m_1(t)]\sin(\omega_1 - \frac{\omega_0}{2})t +$$
$$H[m_2(t)]\cos(\omega_1 + \frac{\omega_0}{2})t + m_2(t)\sin(\omega_1 + \frac{\omega_0}{2})t$$

FIG. 5 illustrates a circuit configuration example to implement the above equation. From respective final results of the equations of USB and LSB, it is understood that the equation is in complete agreement with FIG. 5 showing the configuration of the modulation scheme of this Embodiment.

As described above, according to this Embodiment, by a simple configuration, it is possible to obtain a modulation scheme enabling a double transmission rate of the conventional transmission rate in a range of the frequency bandwidth required for the conventional quadrature modulation scheme.

Described next is a demodulation scheme of this Embodiment to demodulate a modulation signal formed by the modulation scheme of this Embodiment as described above.

The principle of the demodulation scheme will be described first. SSB signals can be demodulated synchronously. For example, multiplication of a USB signal by cos $\omega_c t$ is obtained by shifting the spectrum by $\pm\omega_c$. Passing this signal through a low-pass filter obtains a required baseband signal. This is the same as in the LSB signal. To obtain time-domain expression of the SSB signals, the concept is used of the analytic signal (Pre-envelop) of signal f(t).

FIGS. 10A to 10E show spectral configurations in each processing in the case of demodulating a SSB received signal comprised of the USB signal as shown in FIG. 8E and the LSB signal as shown in FIG. 8F. Herein, as in FIGS. 8A to 8F, in FIGS. 10A to 10E, it is assumed that the triangular mark as shown in FIG. 9A represents the even function component, while the bracket mark as shown in FIG. 9B represents the odd function component.

Upon receiving the SSB signal, the reception system performs the operation expressed by following equations. First, the USB signal as shown in FIG. 10A is multiplied by cos $\omega_1 t$ as expressed in the following equation:

$$\frac{1}{2}\{f(t)e^{j\omega_1 t} + f^*(t)e^{-j\omega_1 t}\} \times \cos\omega_1 t = \quad (10)$$
$$\frac{1}{2}\{f(t)e^{j\omega_1 t} + f^*(t)e^{-j\omega_1 t}\} \times \frac{e^{j\omega_1 t} + e^{-j\omega_1 t}}{2} =$$
$$\frac{1}{2}\{f(t)e^{j2\omega_1 t} + f^*(t)e^{-j2\omega_1 t} + f(t) + f^*(t)\}$$

By this means, as can be seen from FIG. 10B illustrating the result, generated are high-frequency components reaching twice as much as the carrier frequency and baseband component.

Next, removing the components of $\pm 2\omega_1$ reaching twice as much as the carrier frequency by LPF results in the following equation, and a transmission signal is demodulated (FIG. 10E):

$$\frac{1}{2}\{f(t)e^{j2\omega_1 t} + f^*(t)e^{-j2\omega_1 t} + f(t) + f^*(t)\} \to f(t) + f^*(t) \quad (11)$$

In addition, in (11), the arrow "→" represents passing through a filter. In other words, the equation subsequent to the arrow "→" represents a filter passed signal. This is the same as in other equations described later.

With respect to the LSB signal, similarly, multiplying a transmission signal (FIG. 10C) by sin $\omega_1 t$ generates high-frequency components reaching twice as much as the carrier frequency and baseband component as shown in FIG. 10D similarly as in the case of the USB signal. The high-frequency components are also removed by LPF at this point. By this means, the transmission signal is demodulated as shown in FIG. 10E. The processing is expressed in the following equation:

$$\frac{1}{2}\{-f^*(t)e^{j\omega_1 t} + f(t)e^{-j\omega_1 t}\} \times \sin\omega_1 t = \qquad (12)$$
$$\frac{1}{2}\{-f^*(t)e^{j2\omega_1 t}f(t)e^{-j2\omega_1 t} + f(t) + f^*(t)\} \to f^*(t) + f(t)$$

Figure 11:
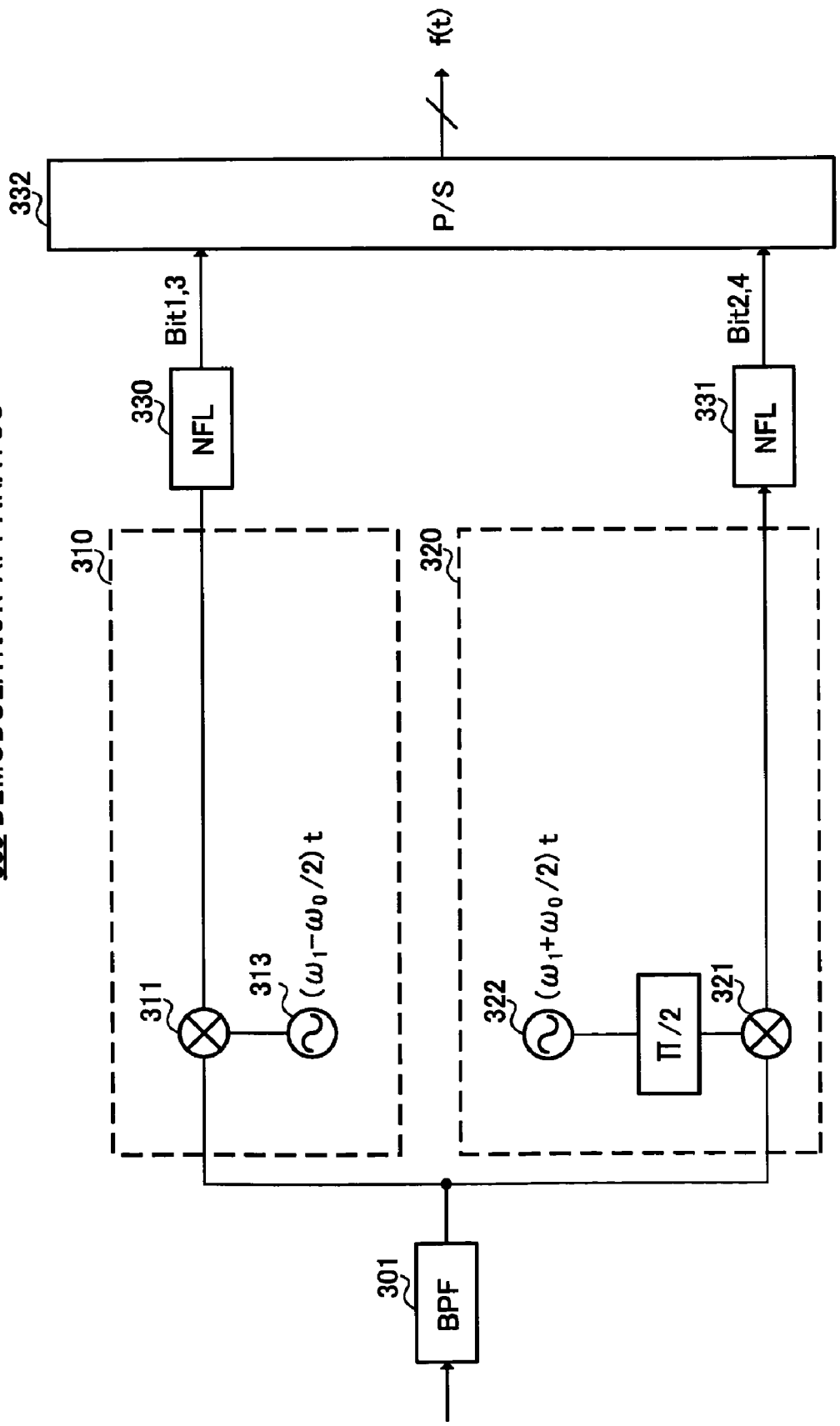
FIG. 11 is a block diagram illustrating a configuration of a demodulation apparatus of Embodiment 1.

FIG. 11 illustrates a configuration example of a demodulation apparatus of this Embodiment. Demodulation apparatus 300 has two frequency-decreasing demodulators, 310 and 320. In demodulation apparatus 300, a received modulation signal is input to two frequency-decreasing demodulators, 310 and 320, via band-pass filter (BPF) 301.

Frequency-decreasing demodulator 310 has a demodulator comprised of frequency signal source 313 and multiplier 311. Frequency-decreasing demodulator 310 multiplies in multiplier 311 the input signal by a cosine curve, from frequency signal source 313, with the frequency $\omega_1 - \omega_0/2$ obtained by subtracting a half the symbol frequency $\omega_0$ from the carrier frequency $\omega_1$. Passing the output through Nyquist filter (NFL) 330 obtains the original signal Bit1, 2.

Frequency-decreasing demodulator 320 has a demodulator comprised of frequency signal source 322 and multiplier 321. Frequency-decreasing SSB demodulator 320 multiplies in multiplier 321 the input signal by a cosine curve, from frequency signal source 322, with the frequency $\omega_1 + \omega_0/2$ obtained by adding a half the symbol frequency $\omega_0$ to the carrier frequency $\omega_1$. Passing the output through Nyquist filter (NFL) 331 obtains the original signal Bit2, 4.

In addition, the Nyquist filter described through this Embodiment is strictly defined as a root Nyquist roll-off filter to obtain Nyquist characteristics overall in transmission and reception.

Next, two-sequence signals Bit1,3 and Bit2,4 are input to parallel/serial transformer (P/S) 332, and P/S 332 outputs received data f(t).

Described below is the reason why using demodulation apparatus 300 as shown in FIG. 11 enables the USB signal and LSB signal to be extracted from the received signal (i.e. transmission signal from modulation apparatus 100) as shown in FIG. 6C where the USB signal and LSB signal are quadrature-multiplexed, using equations.

In demodulation apparatus 300, first, to obtain information $m_1(t)$ in the USB, frequency-decreasing SSB demodulator 310 multiplies cos $(\omega_1 - \omega_0/2)t$ as expressed in the following equation:

$$s_{SSB-QPSK}(t) \times \cos(\omega_1 - \frac{\omega_0}{2})t = \qquad (13)$$
$$\{m_1(t)\cos(\omega_1 - \frac{\omega_0}{2})t + H[m_1(t)]\sin(\omega_1 - \frac{\omega_0}{2})t +$$
$$H[m_2(t)]\cos(\omega_1 + \frac{\omega_0}{2})t + m_2(t)\sin(\omega_1 + \frac{\omega_0}{2})t\} \times$$
$$\cos(\omega_1 - \frac{\omega_0}{2})t = \frac{1}{2}m_1(t)\{1 + \cos2(\omega_1 - \frac{\omega_0}{2})t\} +$$

-continued $$\frac{1}{2}H[m_1(t)]\sin2(\omega_1 - \frac{\omega_0}{2})t + \frac{1}{2}H[m_2(t)]\cos2\omega_1 t +$$
$$\frac{1}{2}[m_2(t)]\cos\omega_0 t + \frac{1}{2}m_2(t)\sin2\omega_1 t + \frac{1}{2}m_2(t)\sin\omega_0 t$$

Passing the output through LPF 314 obtains a signal as expressed in the following equation:

$$\frac{1}{2}m_1(t) + \frac{1}{2}[m_2(t)]\cos\omega_0 t + \frac{1}{2}m_2(t)\sin\omega_0 t \qquad (14)$$

Herein, the fact is used that signals $m_1(t)$ and $m_2(t)$ are Nyquist signals. In other words, substituting $$m_1(t) = (-1)^n \frac{\sin\omega_0 t}{\omega_0 t}, m_2(t)(-1)^m \frac{\sin\omega_0 t}{\omega_0 t}$$

(m and n are integrals) obtains the following equation:

$$\frac{1}{2}m_1(t) + \frac{1}{2}(-1)^m \frac{1-\cos\omega_0 t}{\omega_0 t}\cos\omega_0 t + \frac{1}{2}(-1)^m \frac{\sin\omega_0 t}{\omega_0 t}\sin\omega_0 t \qquad (15)$$

A value of $t=0$ indicating a symbol point is as in the following equation, and $m_1(t)$ can be extracted:

$$\frac{1}{2}m_1(t) + \frac{1}{2}(-1)^m \times 0 \times 1 + \frac{1}{2}(-1)^m \times 0 \times 0 = \frac{1}{2}m_1(t) \qquad (16)$$

Similarly, to obtain information $m_2(t)$ in the USB, frequency-decreasing SSB demodulator 310 multiplies $\sin(\omega_1 + \omega_0/2)t$ as expressed in the following equation:

$$s_{SSB-QPSK}(t) \times \sin(\omega_1 + \frac{\omega_0}{2})t = \qquad (17)$$
$$\{m_1(t)\cos_1(\omega_1 - \frac{\omega_0}{2})t + H[m_1(t)]\sin(\omega_1 - \frac{\omega_0}{2})t + H[m_2(t)]$$
$$\cos(\omega_1 + \frac{\omega_0}{2})t + m_2(t)\sin(\omega_1 + \frac{\omega_0}{2})t\} \times \sin(\omega_1 + \frac{\omega_0}{2})t =$$
$$\frac{1}{2}m_1(t)\sin2\omega_1 t + \frac{1}{2}m_1(t)\sin\omega_0 t - \frac{1}{2}[m_1(t)]\cos2\omega_1 t +$$
$$\frac{1}{2}H[m_1(t)]\cos\omega_0 t + \frac{1}{2}H[m_2(t)]\sin2(\omega_1 + \frac{\omega_0}{2})t\} +$$
$$\frac{1}{2}m_2(t)\{1 - \cos2(\omega_1 + \frac{\omega_0}{2})t\}$$

Passing the output through LPF 315 obtains a signal as expressed in the following equation:

$$\frac{1}{2}m_1(t)\sin\omega_0 t + \frac{1}{2}H[m_1(t)]\cos\omega_0 t + \frac{1}{2}m_2(t) \qquad (18)$$

Herein, the fact is used that signals $m_1(t)$ and $m_2(t)$ are Nyquist signals. In other words, substituting $$m_1(t) = (-1)^n \frac{\sin\omega_0 t}{\omega_0 t}, m_2(t)(-1)^m \frac{\sin\omega_0 t}{\omega_0 t}$$

(m and n are integrals) obtains the following equation:

$$\frac{1}{2}(-1)^n \frac{\sin\omega_0 t}{\omega_0 t} \times \sin\omega_0 t + \frac{1}{2}(-1)^n \frac{1-\sin\omega_0 t}{\omega_0 t} \times \cos\omega_0 t + \frac{1}{2}m_2(t) \quad (19)$$

A value of t=0 indicating a symbol point is as in the following equation, and $m_2(t)$ can be extracted:

$$\frac{1}{2}(-1)^n \frac{1-\cos 2\omega_0 t}{2\omega_0 t} - \frac{1}{2}(-1)^n \frac{1-\cos\omega_0 t}{\omega_0 t} \times \cos\omega_0 t + \frac{1}{2}m_2(t) \rightarrow \quad (20)$$

$$\frac{1}{2}(-1)^n \times 1 \times 0 - \frac{1}{2}(-1)^n \times 0 \times 1 + \frac{1}{2}m_2(t) = \frac{1}{2}m_2(t)$$

In addition, a root Nyquist roll-off filter is generally substituted for LPF. In this case, the Nyquist filter in the transmission system is also replaced with the root Nyquist roll-off filter.

Figure 12:
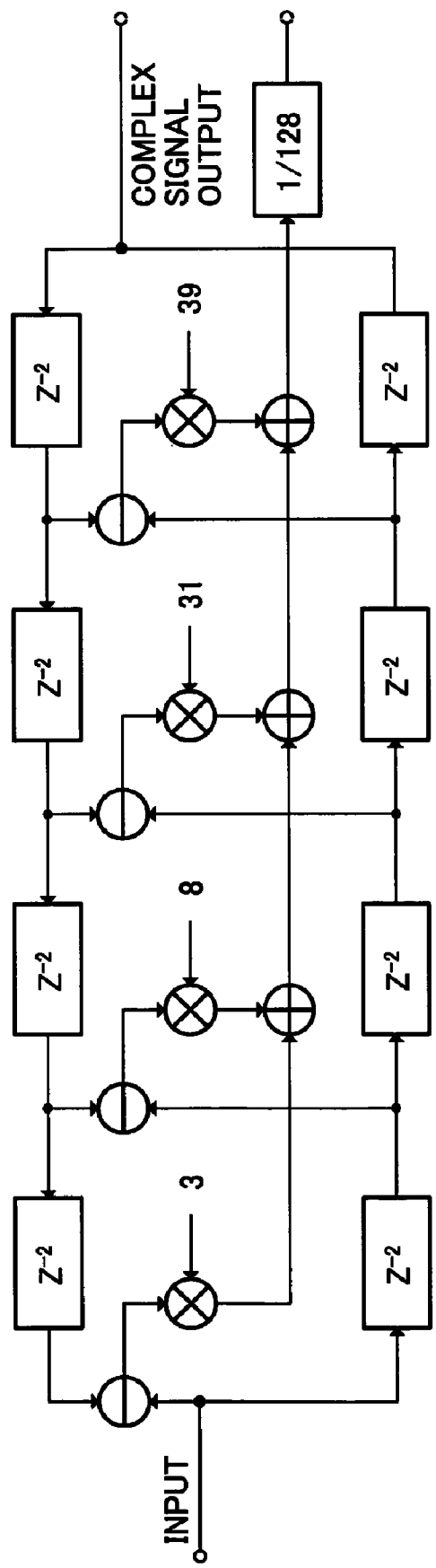
FIG. 12 is a block diagram illustrating a configuration example of a IIR type digital Hilbert filter.

For reference, FIG. 12 illustrates the IIR type digital Hilbert filter as a specific configuration example of a Hilbert transformer used in the transmission system. The principle of Hilbert transform is described briefly. Assuming that inverse Fourier transform of spectra $M_+(\omega)=M(\omega)u(\omega)$ and $M_-(\omega)=M(\omega)u(-\omega)$ are represented by $m_+(t)$ and $m_-(t)$, $2m_+(t)$ is referred to as an analytic signal of m(t). $|M_+(w)|$ and $|M_-(\omega)|$ are not even functions of $\omega$, and therefore, $m_+(t)$ and $m_-(t)$ are complex signals. Further, since $|M_+(\omega)|$ and $|M_-(\omega)|$ are conjugate, $m_+(t)$ and $m_-(t)$ are also conjugate. Herein, $m_h(t)$ is Hilbert transform of m(t), and expressed by the following equation:

$$m_h(t) = \frac{1}{\pi} \int_{-\infty}^{\infty} \frac{m(\alpha)}{t-\alpha} d\alpha \quad (21)$$

Thus, in this Embodiment, the configuration is adopted where first and second frequency-increasing SSB modulators 110 and 120 are provided, carrier frequencies in SSB modulators 110 and 120 are provided with a difference by a frequency corresponding to the symbol frequency (i.e. fundamental frequency of the input symbol), the LSB signal is obtained from SSB modulator 120 set for a higher carrier frequency, while the USB signal is obtained from SSB modulator 110 set for a lower carrier frequency, and the sum of the LSB signal and USB output is the modulation output. Thus, by performing the SSB scheme on the I-axis signal and Q-axis signal, the bandwidth of each side band is expanded to bandwidth BW1 of original both sides that is two times the original side band (FIG. 4C), SSB modulation is performed by using a carrier frequency higher than a carrier frequency used in forming the USB signal by the fundamental frequency of an input symbol in forming the LSB signal, it is thus possible to multiplex the LSB signal and USB signal in the same frequencies (FIG. 4D), and a modulation signal can be obtained with a double transmission rate enabled and a given frequency bandwidth not changed. As a result, it is possible to implement modulation apparatus 100 capable of achieving a double transmission rate of the signal transmission rate of the conventional quadrature modulation scheme in a range of the frequency bandwidth required for the conventional quadrature modulation scheme.

Further, first and second frequency-decreasing SSB demodulators 310 and 320 are provided, the carrier frequency in the SSB demodulator 310 is provided with a difference by a frequency corresponding to the symbol frequency (i.e. fundamental frequency of the transmission symbol), the LSB signal is obtained from the demodulator 320 set for a higher carrier frequency, while the USB signal is obtained from the demodulator 310 set for a lower carrier frequency, and it is thereby possible to implement the demodulation apparatus capable of extracting the USB signal and LSB signal from a received signal comprised of quadrature-multiplexed USB signal and LSB signal.

It is thus possible to improve double the spectral efficiency, and to obtain advantageous effects of, for example, increasing the number of users by about twice, and doubling the transmission rate in existing frequency allocation.

Figure 13:
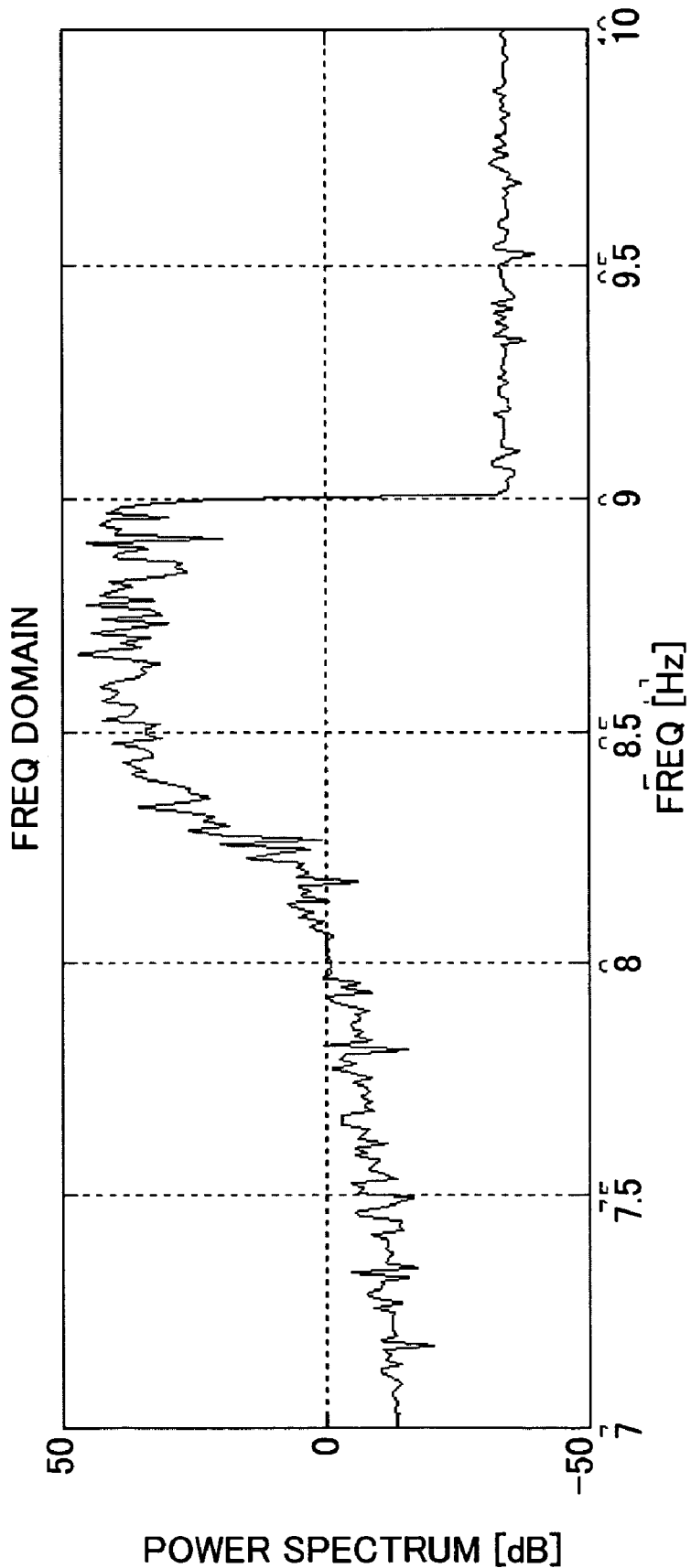
FIG. 13 is a graph showing a simulation result of the LSB signal for bandwidth check.
Figure 14:
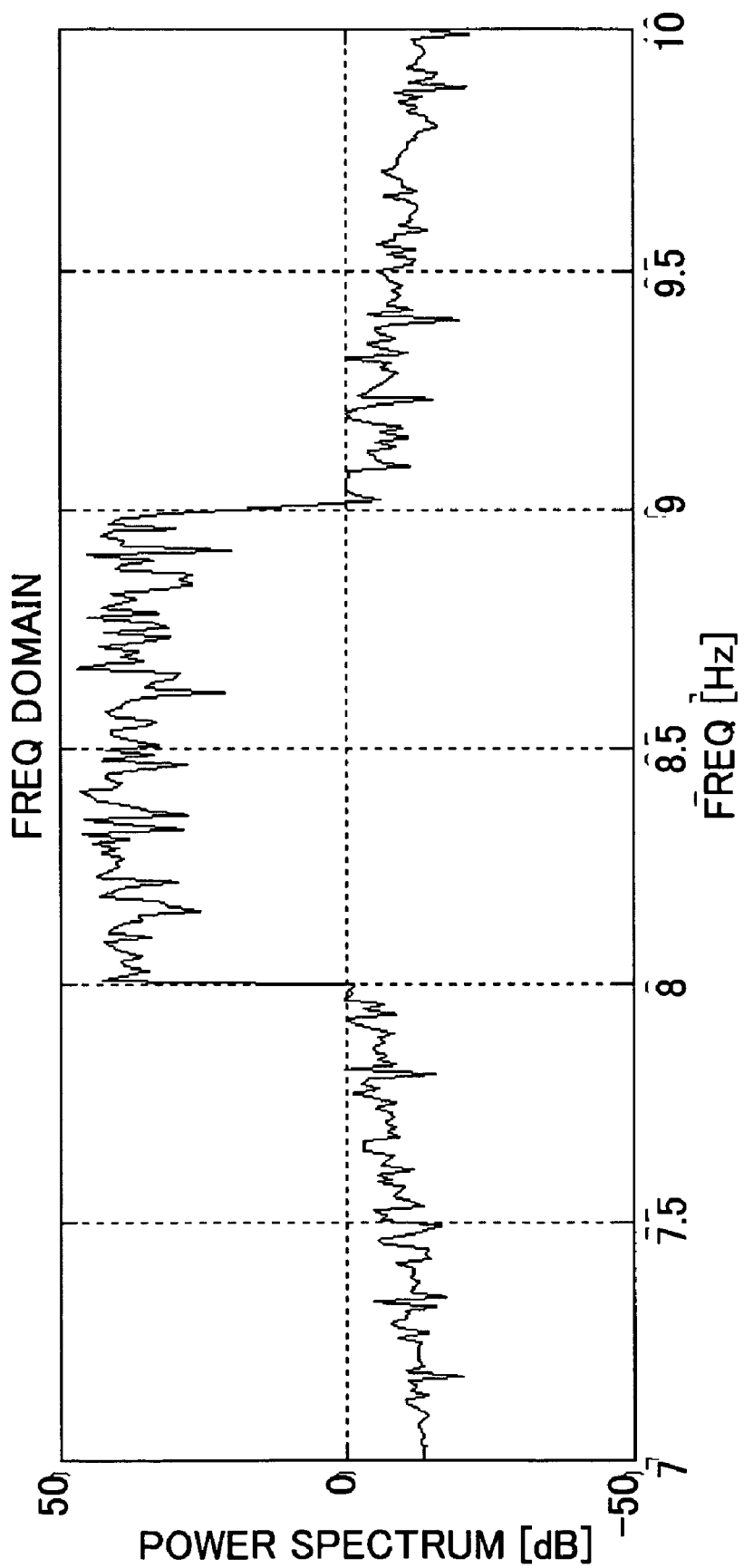
FIG. 14 is a graph showing a simulation result of a combined signal of the USB signal and the LSB signal for bandwidth check.
Figure 15:
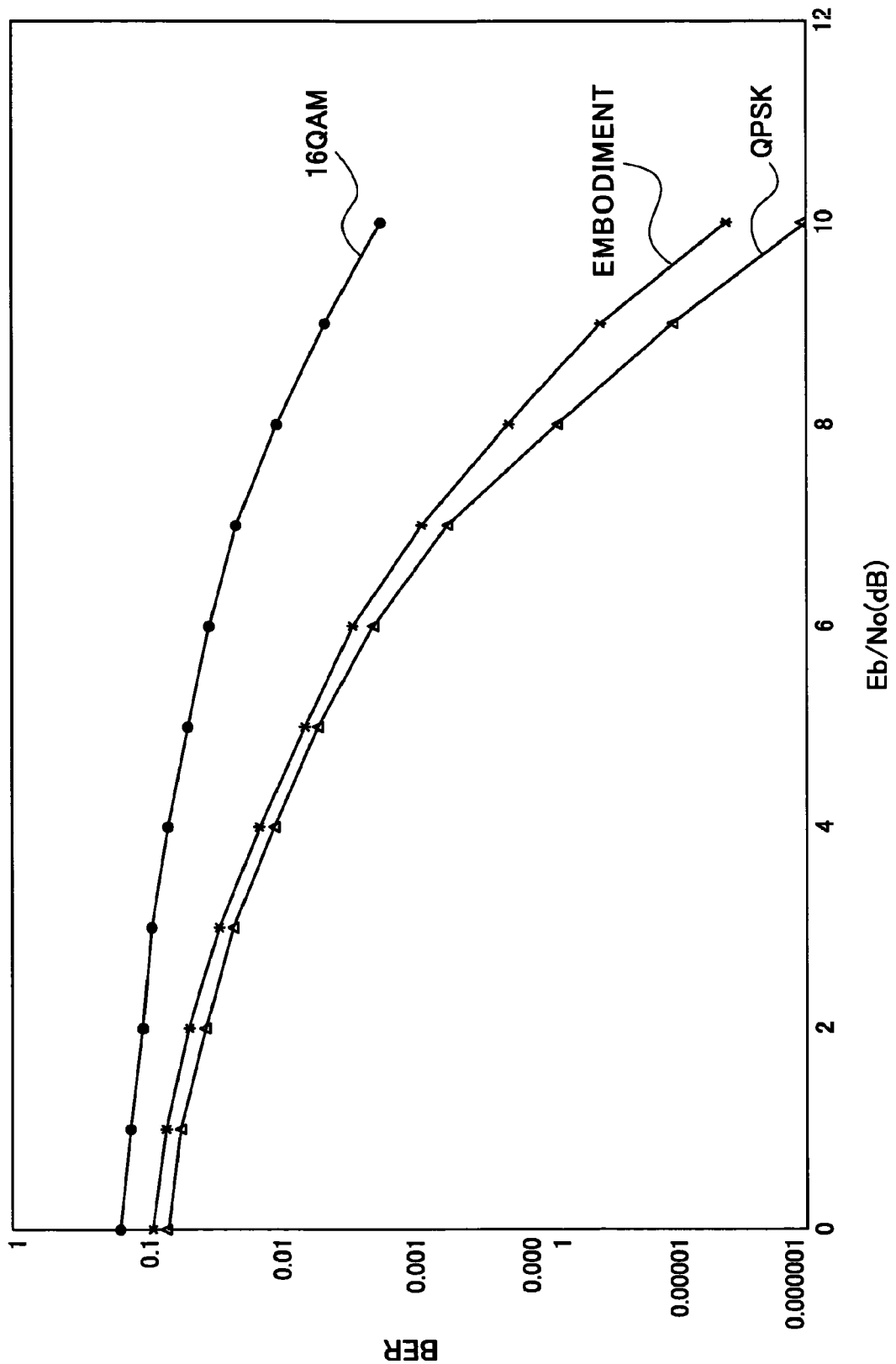
FIG. 15 is a graph showing a simulation result of BER vs. S/N for communication quality check.

FIGS. 13, 14 and 15 show simulation results in the case of using modulation apparatus 100 and demodulation apparatus 300 of this Embodiment. The object of the invention is to improve the spectral efficiency. Accordingly, what to check first is whether or not a bandwidth reliably meets the object. FIG. 13 shows a SSB output configuring one of I-Q axes, lower side band (LSB) It is understood that a bandwidth of −3 dB is 0.5 Hz. Further, a bandwidth up to −50 dB attenuation is limited to 1 Hz. In FIG. 14, the USB and LSB respectively from I and Q are superimposed in the same band, and confirmed to be within a bandwidth of 1 Hz.

What to check next is whether the communication quality of the scheme proposed in the invention is superior to that of 16QAM. FIG. 15 shows BER (Bit Error Rate) vs. S/N (SN ratio) in an AWGN (Additive White Gaussian Noise) environment. As can be seen from FIG. 15, by using modulation apparatus 100 and demodulation apparatus 300 of this Embodiment, it is possible to obtain BER almost equal to that of QPSK, and further obtain S/N characteristics of 4 dB or more even at a point of $10^{-2}$ with respect to 16QAM with the same transmission rate.

In addition, this Embodiment describes the case of implementing the modulation method of the invention using SSB modulators 110 and 120 having the Hilbert transform section as shown in FIG. 5 as a frequency-increasing SSB modulator, but the configuration of the SSB modulator to put the invention into practice is not limited to such a configuration.

The point is that to prepare a first frequency-increasing SSB modulator that performs SSB modulation on a first input signal to obtain a USB signal and a second frequency-increasing SSB modulator that performs SSB modulation on a second input signal to obtain a LSB signal, and to perform by the second frequency-increasing SSB modulator SSB modulation using a carrier frequency higher than a carrier frequency used in the first frequency-increasing SSB modulator by the fundamental frequency of an input symbol.

Similarly, this Embodiment describes the case of implementing the demodulation method of the invention using SSB demodulators 310 and 320 as shown in FIG. 11 as a frequency-decreasing SSB demodulator, but the configuration of the SSB demodulator to put the invention into practice is not limited to such a configuration.

The point is to prepare a first frequency-decreasing SSB demodulator that demodulates an input modulation signal to obtain a first demodulation signal, and a second frequency-decreasing SSB demodulator that demodulates an input modulation signal to obtain a second demodulation signal, and to perform by the second frequency-decreasing SSB demodulator SSB demodulation using a carrier frequency higher than a carrier frequency used in the first frequency-decreasing SSB demodulator by the fundamental frequency of a transmission symbol.

Figure 16:
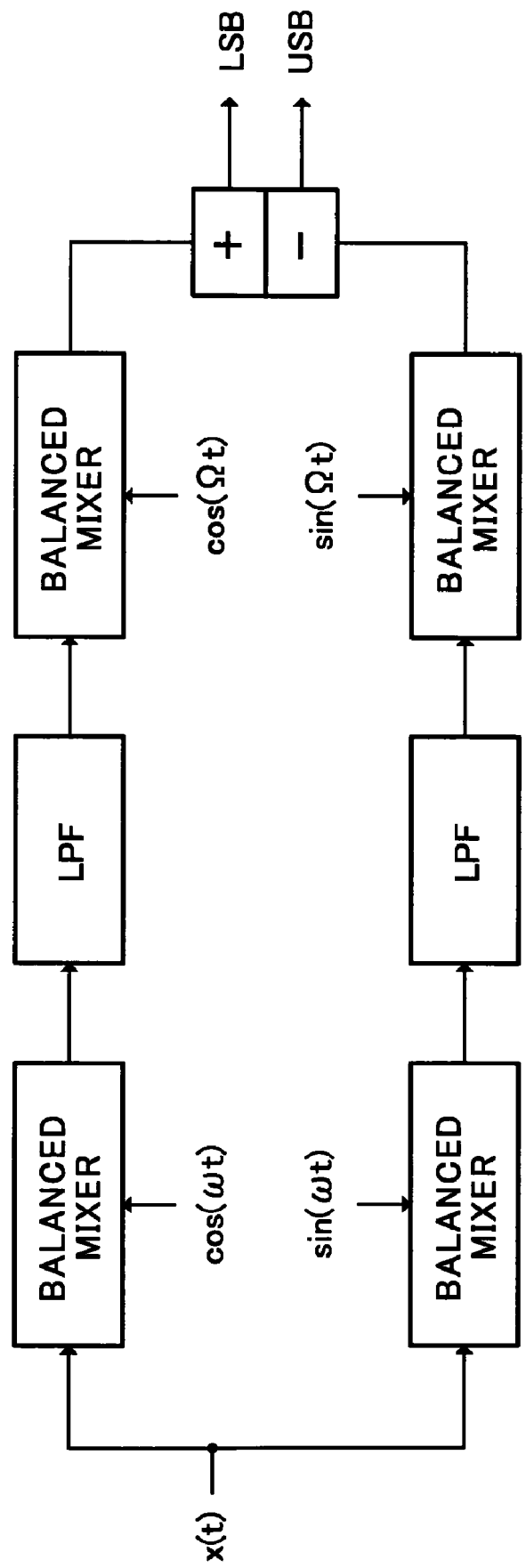
FIG. 16 is a block diagram illustrating another configuration example of the SSB modulator.

As the frequency-increasing SSB modulator, various types have conventionally been proposed and put into practical use, and FIG. 16 shows one example. In the SSB modulator as shown in FIG. 16, two lines of a balanced mixer, low-pass filter, and balanced mixer are provided, input signal X(t) is input to each of the lines, and outputs of the lines undergo addition and subtraction to obtain the LSB signal and USB signal. At this point, a cosine curve is input to the balanced mixer of one line, while a sine curve is input to the balanced mixer of the other line. Then, by selecting as appropriate frequencies $\Omega$ and $\omega$ of the cosine curve and sine curve to input to respective balanced mixers, a LSB signal and USB signal with a desired band are obtained.

In other words, it is possible to put the invention into practice by substituting the frequency-increasing SSB modulator as shown in FIG. 16 for frequency-increasing SSB modulators 110 and 120 in FIG. 5. In this case, values of frequencies $\Omega$ and $\omega$ of the cosine curve and sine curve to input to respective balanced mixers are selected as appropriate so that a SSB modulator to obtain a LSB signal is able to obtain the LSB signal with a carrier frequency higher than a carrier frequency in a SSB modulator to obtain a USB signal by the fundamental frequency of input symbol X(t).

Embodiment 2

This Embodiment proposes a modulation scheme and demodulation scheme that improve the spectral efficiency more than in Embodiment 1.

First, before explaining a configuration of this Embodiment, compared are between a way of signal configuration in Embodiment 1 and a way of signal configuration in Embodiment 2.

FIGS. 17A to 17C illustrate the way of signal configuration in Embodiment 1. Modulation apparatus 100 of Embodiment 1 obtains the LSB signal with the spectrum as shown in FIG. 17A in second frequency-increasing SSB modulator 120, and the USB signal with the spectrum as shown in FIG. 17B in first frequency-increasing SSB modulator 110, combines the signals, and obtains a modulation signal with the spectrum as shown in FIG. 17C.

Figure 18:
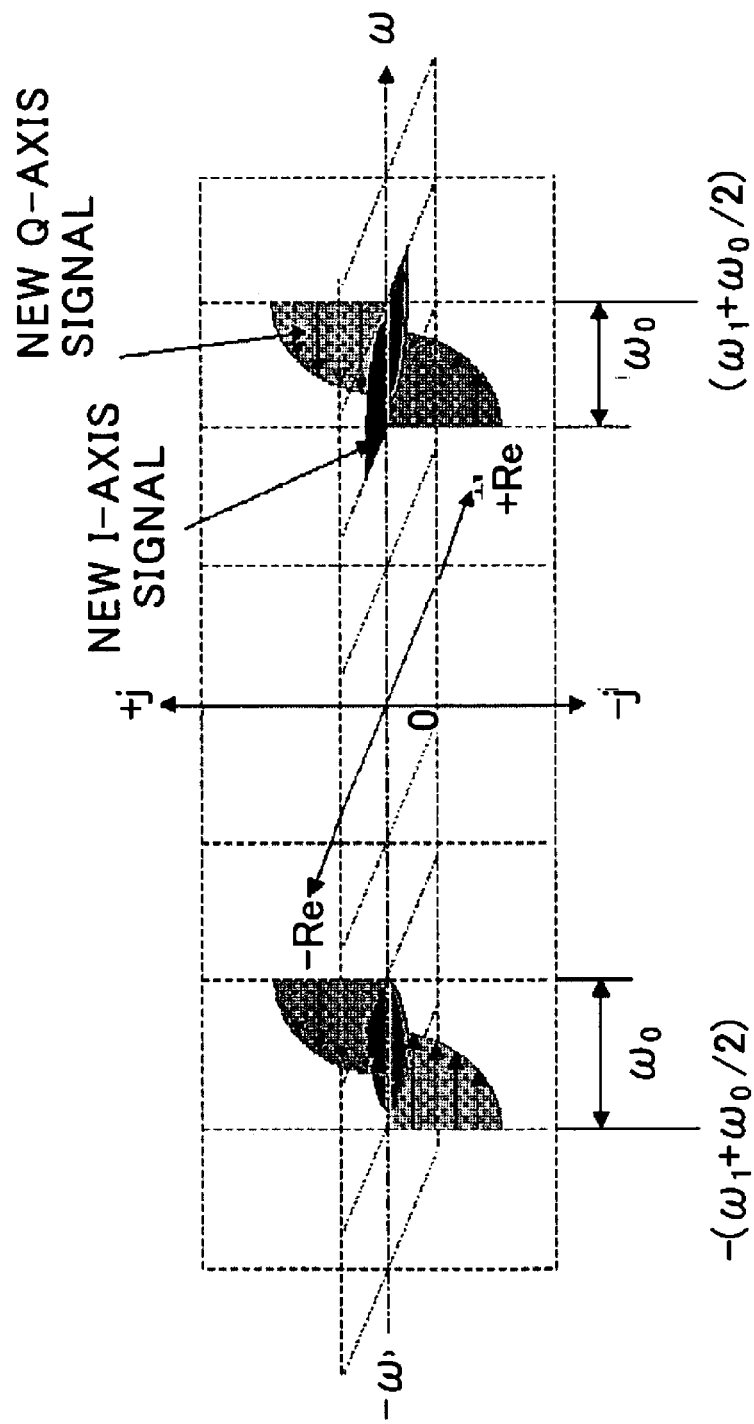
FIG. 18 is a diagram illustrating spectra in frequency complex space of a SSB-multiplexed modulation signal formed in Embodiment 2.

In contrast thereto, this Embodiment proposes forming a modulation signal (SSB-multiplexed modulation signal) with the spectrum as shown in FIG. 18. As can be seen from comparison between FIGS. 18 and 17C, by taking the signal configuration as in this Embodiment (FIG. 18), it is possible to transmit signals twice as many as in Embodiment 1 (FIG. 17C) in the same frequency band.

In other words, Embodiment 1 is regarded as a SSB system of configuring a quadrature-base I-axis signal in the USB (Upper Side Band) on the real axis of the frequency axis, and a quadrature-base Q-axis signal in the LSB (Lower Side Band) on the imaginary axis (system delayed from the real axis by $\pi/2$) on the frequency axis, and multiplexing two signals.

In addition thereto, this Embodiment intends to newly form a LSB signal on the I-axis (on the real axis) and a USB signal on the Q-axis (on the imaginary axis) and also multiplex the signals to transmit.

Figure 19:
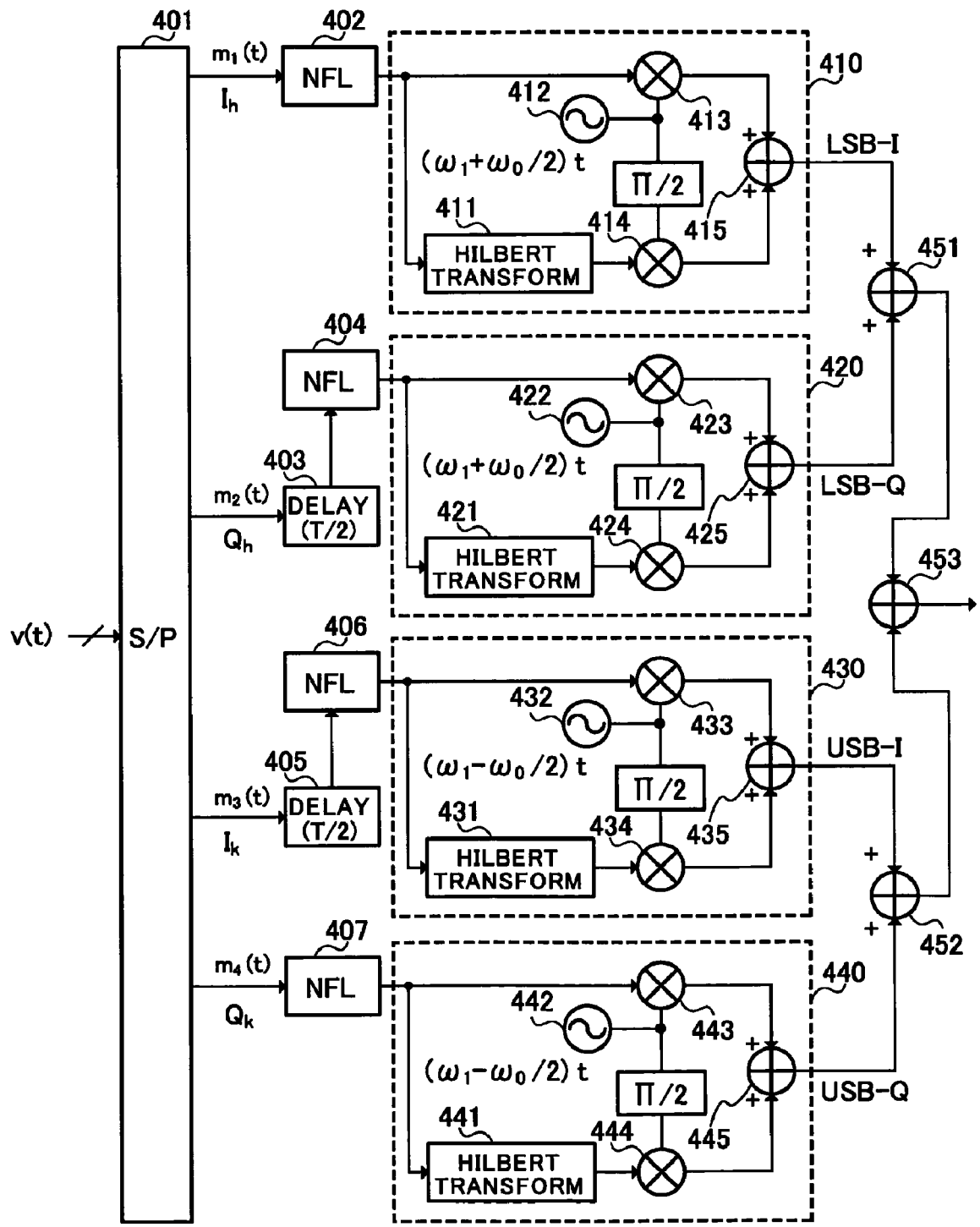
FIG. 19 is a block diagram illustrating a configuration of a modulation apparatus of Embodiment 2.

FIG. 19 illustrates a configuration of modulation apparatus 400 of this Embodiment. Modulation apparatus 400 branches an input signal v(t) into four parallel signals in serial/parallel transformer (S/P) 401. The four signals are referred to as $m_1(t)$, $m_2(t)$, $m_3(t)$ and $m_4(t)$.

The signal $m_1(t)$ is input to LSB modulator (frequency-increasing SSB modulator) 410 through Nyquist filter 402. LSB modulator 410 multiplies in multiplier 413 the input Nyquist signal of signal $m_1(t)$ by a sine curve, from frequency signal source 412, with frequency $\omega_1+\omega_0/2$ obtained by adding a half the symbol frequency $\omega_0$ to carrier frequency $\omega_1$. At the same time, LSB modulator 410 multiplies in multiplier 414 a signal obtained by passing the Nyquist signal of signal $m_1(t)$ through Hilbert transformer 411 by a cosine curve with the frequency $\omega_1+\omega_0/2$ from frequency signal source 412. Next, adder 415 calculates the sum of these two outputs, and a LSB signal (LSB-I) on the frequency real axis is obtained which conveys the signal $m_1(t)$ and has the carrier frequency $\omega_1+\omega_0/2$.

The signal $m_2(t)$ is input to LSB modulator (frequency-increasing SSB modulator) 420 through delayer 403 that provides a delay of a half the symbol duration T and Nyquist filter 404. LSB modulator 420 multiplies in multiplier 424 the Nyquist signal of signal $m_2(t)$ delayed by the half-symbol duration by a cosine curve, from frequency signal source 422, with frequency $\omega_1+\omega_0/2$ obtained by adding a half the symbol frequency $\omega_0$ to carrier frequency $\omega_1$. At the same time, LSB modulator 420 multiplies in multiplier 423 a signal obtained by passing the Nyquist signal of signal $m_2(t)$ delayed by the half-symbol duration though Hilbert transformer 421 by a sine curve with the frequency $\omega_1+\omega_0/2$ from frequency signal source 422. Next, adder 425 calculates the sum of these two outputs, and a LSB signal (LSB-Q) on the frequency imaginary axis is obtained which conveys the signal $m_2(t)$ and has the carrier frequency $\omega_1+\omega_0/2$.

The signal $m_3(t)$ is input to USB modulator (frequency-increasing SSB modulator) 430 through delayer 405 that provides a delay of a half the symbol duration T and Nyquist filter 406. USB modulator 430 multiplies in multiplier 434 the Nyquist signal of signal $m_3(t)$ delayed by the half-symbol duration by a sine curve, from frequency signal source 432, with frequency $\omega_1-\omega_0/2$ obtained by subtracting a half the symbol frequency coo from carrier frequency $\omega_1$. At the same time, USB modulator 430 multiplies in multiplier 433 a signal obtained by passing the Nyquist signal of signal $m_3(t)$ delayed by the half-symbol duration though Hilbert transformer 431 by a cosine curve with the frequency $\omega_1-\omega_0/2$ from frequency signal source 432. Next, adder 435 calculates the sum of these two outputs, and a USB signal (USB-I) on the frequency real axis is obtained which conveys the signal $m_3(t)$ and has the carrier frequency $\omega_1-\omega_0/2$.

The signal $m_4(t)$ is input to USB modulator (frequency-increasing SSB modulator) 440 through Nyquist filter 407. USB modulator 440 multiplies in multiplier 444 the input Nyquist signal of signal $m_4(t)$ by a cosine curve, from frequency signal source 442, with frequency $\omega_1-\omega_0/2$ obtained by subtracting a half the symbol frequency $\omega_0$ from carrier frequency $\omega_1$. At the same time, USB modulator 440 multiplies in multiplier 443 a signal obtained by passing the Nyquist signal of signal $m_4(t)$ through Hilbert transformer 441 by a sine curve with the frequency $\omega_1-\omega_0/2$ from frequency signal source 442. Next, adder 445 calculates the sum of these two outputs, and a USB signal (USB-Q) on the frequency imaginary axis is obtained which conveys the signal $m_4(t)$ and has the carrier frequency $\omega_1-\omega_0/2$.

Modulation apparatus 400 adds in adder 451 the LSB signal (LSB-I) on the frequency real axis obtained from LSB modulator 410 and the LSB signal (LSB-Q) on the frequency imaginary axis obtained from LSB modulator 420. Modulation apparatus 400 further adds in adder 452 the USB signal (USB-I) on the frequency real axis obtained from USB modulator 430 and the USB signal (USB-Q) on the frequency imaginary axis obtained from USB modulator 440. Then, by adding in adder 453 addition outputs from adder 451 and adder 452, the apparatus 400 obtains a final SSB-multiplexed modulation signal.

By this means, modulation apparatus 400 is capable of implementing a further double signal transmission rate without broadening the frequency bandwidth as compared with modulation apparatus 100 of Embodiment 1.

Herein, modulation of $m_1(t)$, $m_2(t)$, $m_3(t)$ and $m_4(t)$ is expressed in equations.

LSB on the real-axis side (LSB-I):

$$s_{SSB-QPSK} \times \cos\left(\omega_1 + \frac{\omega_0}{2}\right)t = \quad (22)$$

$$\{s_{LSB-Re}(t) + s_{LSB-Im}(t) + s_{USB-Re}(t) + s_{USB-Im}(t)\} \times \cos\left(\omega_1 + \frac{\omega_0}{2}\right)$$

$$t\{m_1(t)\cos\left(\omega_1 + \frac{\omega_0}{2}\right)t + H[m_1(T)]\sin\left(\omega_1 + \frac{\omega_0}{2}\right)t +$$

$$H[m_2(t)]\cos\left(\omega_1 + \frac{\omega_0}{2}\right)t - m_2(t)\sin\left(\omega_1 + \frac{\omega_0}{2}\right)t +$$

$$m_3(t)\cos\left(\omega_1 - \frac{\omega_0}{2}\right)t - H[m_3(T)]\sin\left(\omega_1 - \frac{\omega_0}{2}\right)t +$$

$$H[m_4(t)]\cos\left(\omega_1 - \frac{\omega_0}{2}\right)t + m_4(t)\sin\left(\omega_1 - \frac{\omega_0}{2}\right)t\} \times \cos\left(\omega_1 + \frac{\omega_0}{2}\right)t$$

LSB on the imaginary-axis side (LSB-Q):

$$s_{LSB-Im}(t) = H[m_2(t)]\cos\left(\omega_1 + \frac{\omega_0}{2}\right)t - m_2(t)\sin\left(\omega_1 + \frac{\omega_0}{2}\right)t \quad (23)$$

$$= \frac{1}{2}H[m_2(t)]\left\{e^{j\left(\omega_1 + \frac{\omega_0}{2}\right)t} + e^{-j\left(\omega_1 + \frac{\omega_0}{2}\right)t}\right\} + j\frac{1}{2}m_2(t)$$

$$\left\{e^{j\left(\omega_1 + \frac{\omega_0}{2}\right)t} - e^{-j\left(\omega_1 + \frac{\omega_0}{2}\right)t}\right\}$$

$$= j\left\{m_2(t) - j\frac{1}{2}H[m_2(t)]\right\}e^{j\left(\omega_1 + \frac{\omega_0}{2}\right)t} - j\{m_2(t) +$$

$$jH[m_2(t)]\}e^{-j\left(\omega_1 + \frac{\omega_0}{2}\right)t}$$

$$= jm_{2-}(t)e^{j\left(\omega_1 + \frac{\omega_0}{2}\right)t} - jm_{2+}(t)e^{-j\left(\omega_1 + \frac{\omega_0}{2}\right)t}$$

USB on the real-axis side (USB-I):

$$s_{USB-Re}(t) = m_3(t)\cos\left(\omega_1 - \frac{\omega_0}{2}\right)t - H[m_3(T)]\sin\left(\omega_1 - \frac{\omega_0}{2}\right)t \quad (24)$$

$$= \frac{1}{2}m_3(t)\left\{e^{j\left(\omega_1 - \frac{\omega_0}{2}\right)t} + e^{-j\left(\omega_1 - \frac{\omega_0}{2}\right)t}\right\} + j\frac{1}{2}H$$

$$[m_3(T)]\left\{e^{j\left(\omega_1 - \frac{\omega_0}{2}\right)t} - e^{-j\left(\omega_1 - \frac{\omega_0}{2}\right)t}\right\}$$

$$= \frac{1}{2}\{m_3(t) + jH[m_3(T)]\}e^{j\left(\omega_1 - \frac{\omega_0}{2}\right)t} + \frac{1}{2}\{m_3(t) -$$

$$jH[m_3(T)]\}e^{-j\left(\omega_1 - \frac{\omega_0}{2}\right)t}$$

$$= \frac{1}{2}m_{3+}(t)e^{j\left(\omega_1 - \frac{\omega_0}{2}\right)t} + \frac{1}{2}m_{3-}(t)e^{-j\left(\omega_1 - \frac{\omega_0}{2}\right)t}$$

USB on the imaginary-axis side (USB-Q):

$$s_{USB-Im}(t) = H[m_4(t)]\cos\left(\omega_1 - \frac{\omega_0}{2}\right)t + m_4(t)\sin\left(\omega_1 - \frac{\omega_0}{2}\right)t \quad (25)$$

$$= \frac{1}{2}H[m_4(t)]\left\{e^{j\left(\omega_1 - \frac{\omega_0}{2}\right)t} + e^{-j\left(\omega_1 - \frac{\omega_0}{2}\right)t}\right\} -$$

$$j\frac{1}{2}m_4(t)\left\{e^{j\left(\omega_1 - \frac{\omega_0}{2}\right)t} - e^{-j\left(\omega_1 - \frac{\omega_0}{2}\right)t}\right\}$$

-continued $$= -j\left\{m_4(t) + j\frac{1}{2}H[m_4(t)]\right\}e^{j\left(\omega_1 - \frac{\omega_0}{2}\right)t} + j\{m_4(t) -$$

$$jH[m_4(t)]\}e^{-j\left(\omega_1 - \frac{\omega_0}{2}\right)t}$$

$$= -jm_{4+}(t)e^{j\left(\omega_1 - \frac{\omega_0}{2}\right)t} + jm_{4-}(t)e^{-j\left(\omega_1 - \frac{\omega_0}{2}\right)t}$$

Totaling (combining) these equations, a modulation output i.e. an output from adder 453 is given by the following equation:

$$s_{SSB-QPSK} = s_{LSB-Re}(t) + s_{LSB-Im}(t) + s_{USB-Re}(t) + s_{USB-Im}(t) \quad (26)$$

$$= m_1(t)\cos\left(\omega_1 + \frac{\omega_0}{2}\right)t + H[m_1(T)]\sin\left(\omega_1 + \frac{\omega_0}{2}\right)t +$$

$$H[m_2(t)]\cos\left(\omega_1 + \frac{\omega_0}{2}\right)t - m_2(t)\sin\left(\omega_1 + \frac{\omega_0}{2}\right)t +$$

$$m_3(t)\cos\left(\omega_1 - \frac{\omega_0}{2}\right)t - H[m_3(T)]\sin\left(\omega_1 - \frac{\omega_0}{2}\right)t +$$

$$H[m_4(t)]\cos\left(\omega_1 - \frac{\omega_0}{2}\right)t + m_4(t)\sin\left(\omega_1 - \frac{\omega_0}{2}\right)t$$

A reception system of this Embodiment will be described below.

Figure 20:
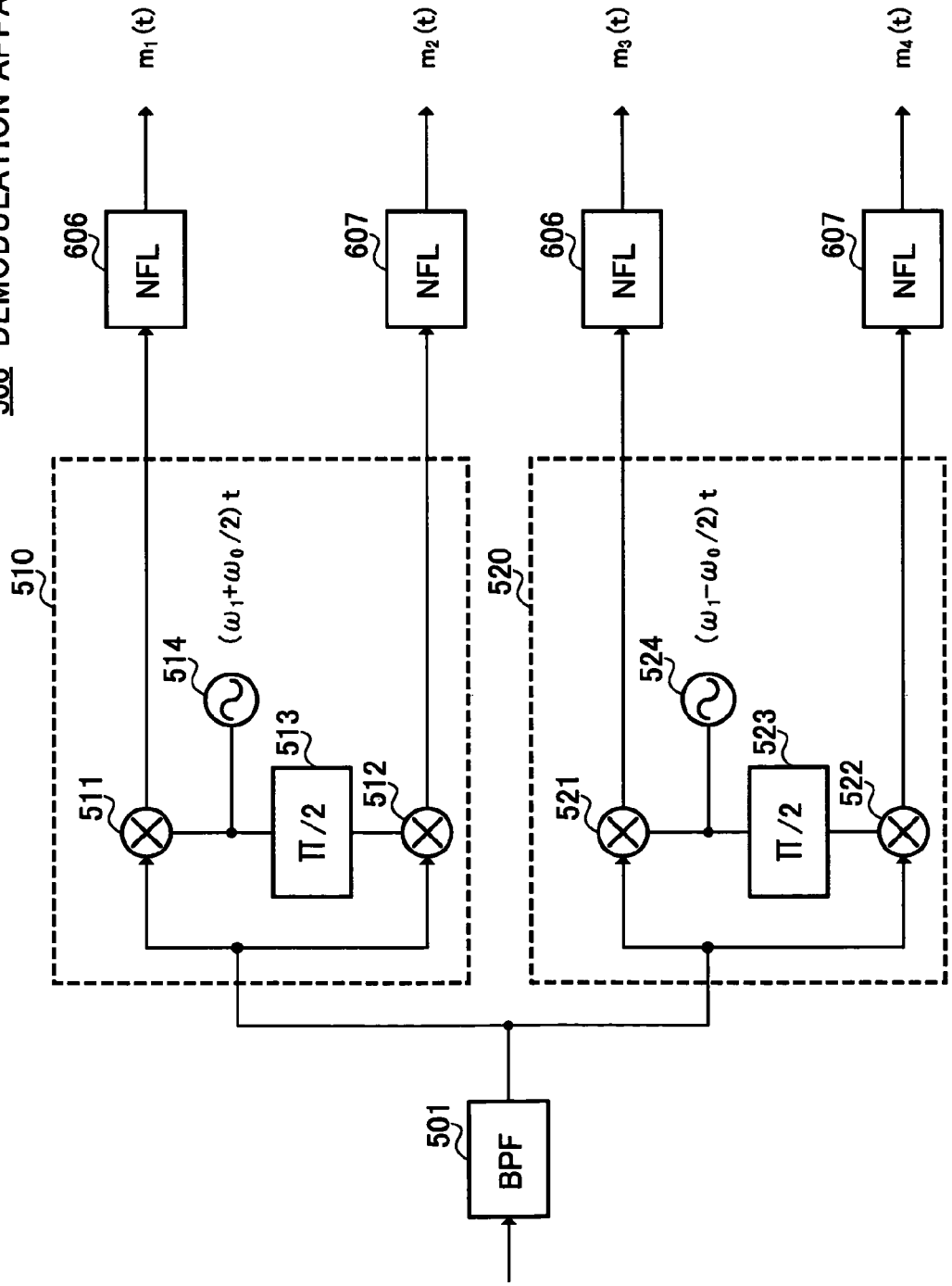
FIG. 20 is a block diagram illustrating a configuration of a demodulation apparatus of Embodiment 2.

FIG. 20 illustrates a configuration example of a demodulation apparatus of this Embodiment. Demodulation apparatus 500 has two frequency-decreasing demodulators, 510 and 520. In demodulation apparatus 500, a received modulation signal is input to two frequency-decreasing demodulators, 510 and 520, via band-pass filter (BPF) 501.

Frequency-decreasing demodulator 510 has frequency signal source 514, multipliers 511 and 512, and π/2 shifter 513. Frequency-decreasing demodulator 510 multiplies in multiplier 511 the input signal by a sine curve, from frequency signal source 514, with frequency $\omega_1+\omega_0/2$ obtained by adding a half the symbol frequency $\omega_0$ to carrier frequency $\omega_1$. Further, the demodulator 510 multiplies in multiplier 512 the signal by a cosine curve from frequency signal source 514. Passing outputs from multipliers 511 and 512 through the Nyquist filter (NFL) restores the signals $m_1$ and $m_2$, respectively.

Frequency-decreasing demodulator 520 has frequency signal source 524, multipliers 521 and 522, and π/2 shifter 523. Frequency-decreasing demodulator 520 multiplies in multiplier 521 the input signal by a sine curve, from frequency signal source 524, with frequency $\omega_1-\omega_0/2$ obtained by subtracting a half the symbol frequency $\omega_0$ from carrier frequency $\omega_1$. Further, the demodulator 520 multiplies in multiplier 522 the signal by a cosine curve from frequency signal source 524. Passing outputs from multipliers 521 and 522 through the Nyquist filter (NFL) restores the signals $m_3$ and $m_4$, respectively.

In other words, demodulation apparatus 500 multiplies the transmitted signal by each of carrier frequencies of the USB and LSB, and thereby restores the original signals, $m_1(t)$, $m_2(t)$, $m_3(t)$ and $m_4(t)$ before undergoing modulation.

First, to obtain information $m_1(t)$ on the LSB, $\cos{(\omega_1+\omega_0/2)}$ t is multiplied as expressed in the following equation:

$$s_{SSB-QPSK} \times \cos\left(\omega_1 + \frac{\omega_0}{2}\right)t = \quad (27)$$

$$\{s_{LSB-Re}(t) + s_{LSB-Im}(t) + s_{USB-Re}(t) + s_{USB-Im}(t)\} \times \cos\left(\omega_1 + \frac{\omega_0}{2}\right)t =$$

-continued $$\{m_1(t)\cos\left(\omega_1 + \frac{\omega_0}{2}\right)t + H[m_1(T)]\sin\left(\omega_1 + \frac{\omega_0}{2}\right)t +$$
$$H[m_2(t)]\cos\left(\omega_1 + \frac{\omega_0}{2}\right)t - m_2(t)\sin\left(\omega_1 + \frac{\omega_0}{2}\right)t +$$
$$m_3(t)\cos\left(\omega_1 - \frac{\omega_0}{2}\right)t - H[m_3(T)]\sin\left(\omega_1 - \frac{\omega_0}{2}\right)t + H[m_4(t)]$$
$$\cos\left(\omega_1 - \frac{\omega_0}{2}\right)t + m_4(t)\sin\left(\omega_1 - \frac{\omega_0}{2}\right)t\} \times \cos\left(\omega_1 + \frac{\omega_0}{2}\right)t$$

For extraction of $m_1(t)$, the equation is expanded as expressed in the following equation:

$$\{m_1(t)\cos\left(\omega_1 + \frac{\omega_0}{2}\right)t + H[m_1(T)]\sin\left(\omega_1 + \frac{\omega_0}{2}\right)t\} \times \cos\left(\omega_1 + \frac{\omega_0}{2}\right)t = \quad (28)$$
$$m_1(t)\cos^2\left(\omega_1 + \frac{\omega_0}{2}\right)t + H[m_1(T)]\sin\left(\omega_1 + \frac{\omega_0}{2}\right)t\cos\left(\omega_1 + \frac{\omega_0}{2}\right)t =$$
$$\frac{1}{2}m_1(t)\{1 + \cos 2\left(\omega_1 + \frac{\omega_0}{2}\right)t\} + \frac{1}{2}H[m_1(T)]\sin 2\left(\omega_1 + \frac{\omega_0}{2}\right)t$$

At this point, passing through the LPF obtains the following equation:

$$\frac{1}{2}m_1(t)\{1 + \cos 2\left(\omega_1 + \frac{\omega_0}{2}\right)t\} + \frac{1}{2}H[m_1(T)]\sin 2\left(\omega_1 + \frac{\omega_0}{2}\right)t \rightarrow \frac{1}{2}m_1(t) \quad (29)$$

Described next is removal of $m_2(t)$ that becomes one of interfering signals.

$$\{H[m_2(t)]\cos\left(\omega_1 + \frac{\omega_0}{2}\right)t - m_2(t)\sin\left(\omega_1 + \frac{\omega_0}{2}\right)t\} \times \cos\left(\omega_1 + \frac{\omega_0}{2}\right)t = \quad (30)$$
$$H[m_2(t)]\cos^2\left(\omega_1 + \frac{\omega_0}{2}\right)t - m_2(t)\sin\left(\omega_1 + \frac{\omega_0}{2}\right)t\cos\left(\omega_1 + \frac{\omega_0}{2}\right)t =$$
$$\frac{1}{2}H[m_2(t)](1 + \cos 2\left(\omega_1 + \frac{\omega_0}{2}\right)t - m_2(t)\sin 2\left(\omega_1 + \frac{\omega_0}{2}\right)t$$

At this point, passing through the LPF obtains the following equation:

$$\frac{1}{2}H[m_2(t)](1 + \cos 2\left(\omega_1 + \frac{\omega_0}{2}\right)t - m_2(t)\sin 2\left(\omega_1 + \frac{\omega_0}{2}\right)t \rightarrow \frac{1}{2}H[m_2(t)] \quad (31)$$

This signal is orthogonal to $m_1(t)$, and therefore, is zero in t=0 that is of sampling slot of $m_1(t)$.

Described next is removal of $m_3(t)$ that becomes one of interfering signals.

$$\{m_3(t)\cos\left(\omega_1 - \frac{\omega_0}{2}\right)t - H[m_3(T)]\sin\left(\omega_1 - \frac{\omega_0}{2}\right)t\} \times \cos\left(\omega_1 + \frac{\omega_0}{2}\right)t = \quad (32)$$
$$m_3(t)\cos\left(\omega_1 - \frac{\omega_0}{2}\right)t\cos\left(\omega_1 + \frac{\omega_0}{2}\right)t -$$
$$H[m_3(T)]\sin\left(\omega_1 - \frac{\omega_0}{2}\right)t \times \cos\left(\omega_1 + \frac{\omega_0}{2}\right)t =$$
$$\frac{1}{2}m_3(t)(\cos 2\omega_1 t + \cos\omega_0 t) - \frac{1}{2}H[m_3(t)](\sin 2\omega_1 t - \sin\omega_0 t)$$

At this point, passing through the LPF obtains the following equation:

$$\frac{1}{2}m_3(t)(\cos 2\omega_1 t + \cos\omega_0 t) - \frac{1}{2}H[m_3(T)](\sin 2\omega_1 t - \sin\omega_0 t) \rightarrow \quad (33)$$
$$\frac{1}{2}m_3(t)\cos\omega_0 t + \frac{1}{2}H[m_3(T)]\sin\omega_0 t$$

This signal is of lower SSB i.e. LSB with a carrier of frequency $\omega_0$. In other words, the signal has a spectrum that attenuates from the frequency $\omega_0$ to lower frequencies in Nyquist characteristics. Accordingly, vigorous roll-off occurs at frequencies of $\omega_0/2$ or more against the filter having Nyquist characteristics from zero to higher frequencies in the Nyquist filter subsequently provided. Particularly, when the roll-off rate is "0", this signal cannot be passed through the Nyquist filter. Further, as is generally performed, communications are often provided with the strong error correcting function in a subsequent stage to make the bandwidth smaller than the Nyquist bandwidth without setting the roll-off rate at "0", and by applying this technique to this system on a mutatis mutandis basis, passage of signal $m_3(t)$ is sufficiently inhibited.

Described next is removal of $m_4(t)$ that becomes one of interfering signals.

$$\{H[m_4(t)]\cos\left(\omega_1 - \frac{\omega_0}{2}\right)t - m_4(t)\sin\left(\omega_1 - \frac{\omega_0}{2}\right)t\} \times \cos\left(\omega_1 + \frac{\omega_0}{2}\right)t = \quad (34)$$
$$H[m_4(t)]\cos\left(\omega_1 - \frac{\omega_0}{2}\right)t\cos\left(\omega_1 + \frac{\omega_0}{2}\right)t -$$
$$m_4(t)\sin\left(\omega_1 - \frac{\omega_0}{2}\right)t\cos\left(\omega_1 + \frac{\omega_0}{2}\right)t =$$
$$\frac{1}{2}H[m_4(t)](\cos 2\omega_1 t + \cos\omega_0 t) - \frac{1}{2}m_4(t)(\sin 2\omega_1 t - \sin\omega_0 t)$$

At this point, passing through the LPF obtains the following equation:

$$\frac{1}{2}H[m_4(t)](\cos 2\omega_1 t + \cos\omega_0 t) - \frac{1}{2}m_4(t)(\sin 2\omega_1 t - \sin\omega_0 t) \rightarrow \quad (35)$$
$$\frac{1}{2}H[m_4(t)]\cos\omega_0 t + \frac{1}{2}m_4(t)\sin\omega_0 t$$

This signal is of lower SSB i.e. LSB with a carrier of frequency $\omega_0$ in the imaginary domain. In other words, the signal has a spectrum that attenuates from the frequency $\omega_0$ to lower frequencies in Nyquist characteristics. Accordingly, vigorous roll-off occurs at frequencies of $\omega_0/2$ or more against the filter having Nyquist characteristics from zero to higher frequencies in the Nyquist filter subsequently provided. Particularly, when the roll-off rate is "0", this signal cannot be passed through the Nyquist filter. Further, as is generally performed, communications are often provided with the strong error correcting function in a subsequent stage to make the bandwidth smaller than the Nyquist bandwidth without setting the roll-off-rate at "0", and by applying this technique to this system on a mutatis mutandis basis, passage of signal $m_4(t)$ is sufficiently inhibited. At the same time, the first term $H[m_4(t)]/2$ is zero in $m_1(t)$-sampling slot t=0, and therefore, both the first and second terms are zero.

Next, to obtain information $m_2(t)$ on the LSB, $\sin(\omega_1+\omega_0/2)t$ is multiplied as expressed in the following equation:

$$s_{SSB-QPSK} \times \sin\left(\omega_1 + \frac{\omega_0}{2}\right)t = \{s_{LSB-Re}(t) + s_{LSB-Im}(t) + \quad (36)$$

$$s_{USB-Re}(t) + s_{USB-Im}(t)\} \times$$

$$\sin\left(\omega_1 + \frac{\omega_0}{2}\right)t$$

$$= \{m_1(t)\cos\left(\omega_1 + \frac{\omega_0}{2}\right)t +$$

$$H[m_1(T)]\sin\left(\omega_1 + \frac{\omega_0}{2}\right)t +$$

$$H[m_2(t)]\cos\left(\omega_1 + \frac{\omega_0}{2}\right)t -$$

$$m_2(t)\sin\left(\omega_1 + \frac{\omega_0}{2}\right)t +$$

$$m_3(t)\cos\left(\omega_1 - \frac{\omega_0}{2}\right)t -$$

$$H[m_3(T)]\sin\left(\omega_1 - \frac{\omega_0}{2}\right)t +$$

$$H[m_4(t)]\cos\left(\omega_1 - \frac{\omega_0}{2}\right)t +$$

$$m_4(t)\sin\left(\omega_1 - \frac{\omega_0}{2}\right)t\} \times$$

$$\sin\left(\omega_1 + \frac{\omega_0}{2}\right)t$$

For elimination of $m_1(t)$, the equation is expanded as expressed in the following equation:

$$\{m_1(t)\cos\left(\omega_1 + \frac{\omega_0}{2}\right)t + H[m_1(T)]\sin\left(\omega_1 + \frac{\omega_0}{2}\right)t\} \times \sin\left(\omega_1 + \frac{\omega_0}{2}\right)t = \quad (37)$$

$$m_1(t)\cos\left(\omega_1 + \frac{\omega_0}{2}\right)t\sin\left(\omega_1 + \frac{\omega_0}{2}\right)t + H[m_1(T)]\sin^2\left(\omega_1 + \frac{\omega_0}{2}\right)t =$$

$$\frac{1}{2}m_1(t)\sin2\left(\omega_1 + \frac{\omega_0}{2}\right)t + \frac{1}{2}H[m_1(T)]\{1 - \cos2\left(\omega_1 + \frac{\omega_0}{2}\right)t\}$$

At this point, passing through the LPF obtains the following equation:

$$\frac{1}{2}m_1(t)\sin2\left(\omega_1 + \frac{\omega_0}{2}\right)t + \frac{1}{2}H[m_1(T)]\{1 - \cos2\left(\omega_1 + \frac{\omega_0}{2}\right)t\} \to \quad (38)$$

$$\frac{1}{2}H[m_1(T)]$$

This signal is orthogonal to $m_2(t)$, and therefore, is zero in $t=0$ that is of sampling slot of $m_2(t)$.

Next, extraction of $m_2(t)$ is performed.

$$\{H[m_2(t)]\cos\left(\omega_1 + \frac{\omega_0}{2}\right)t - m_2(t)\sin\left(\omega_1 + \frac{\omega_0}{2}\right)t\} \times \sin\left(\omega_1 + \frac{\omega_0}{2}\right)t = \quad (39)$$

$$H[m_2(t)]\cos\left(\omega_1 + \frac{\omega_0}{2}\right)t\sin\left(\omega_1 + \frac{\omega_0}{2}\right)t - m_2(t)\sin^2\left(\omega_1 + \frac{\omega_0}{2}\right)t =$$

$$\frac{1}{2}H[m_2(t)]\sin2\left(\omega_1 + \frac{\omega_0}{2}\right)t - \frac{1}{2}m_2(t)(1 - \cos2\left(\omega_1 + \frac{\omega_0}{2}\right)t$$

At this point, passing through the LPF obtains the following equation:

$$= \frac{1}{2}H[m_2(t)]\sin2\left(\omega_1 + \frac{\omega_0}{2}\right)t - \quad (40)$$

$$\frac{1}{2}m_2(t)(1 - \cos2\left(\omega_1 + \frac{\omega_0}{2}\right)t \to -\frac{1}{2}m_2(t)$$

Thus, extraction of $m_2(t)$ can be performed.

Described next is removal of $m_3(t)$ that becomes one of interfering signals.

$$\{m_3(t)\cos\left(\omega_1 - \frac{\omega_0}{2}\right)t - H[m_3(T)]\sin\left(\omega_1 - \frac{\omega_0}{2}\right)t\} \times \sin\left(\omega_1 + \frac{\omega_0}{2}\right)t = \quad (41)$$

$$m_3(t)\cos\left(\omega_1 - \frac{\omega_0}{2}\right)t\sin\left(\omega_1 + \frac{\omega_0}{2}\right)t -$$

$$H[m_3(T)]\sin\left(\omega_1 - \frac{\omega_0}{2}\right)t \times \sin\left(\omega_1 + \frac{\omega_0}{2}\right)t =$$

$$\frac{1}{2}m_3(t)(\sin2\omega_1 t + \sin\omega_0 t) - \frac{1}{2}H[m_3(T)](\cos2\omega_1 t - \cos\omega_0 t)$$

At this point, passing through the LPF obtains the following equation:

$$\frac{1}{2}m_3(t)(\sin2\omega_1 t + \sin\omega_0 t) - \frac{1}{2}H[m_3(T)](\cos2\omega_1 t - \cos\omega_0 t) \to \quad (42)$$

$$\frac{1}{2}m_3(t)\sin\omega_0 t + \frac{1}{2}H[m_3(T)]\cos\omega_0 t$$

This signal is of upper SSB i.e. USB with a carrier of frequency $\omega_0$ the imaginary domain. In other words, the signal has a spectrum that attenuates from the frequency $\omega_0$ to higher frequencies in Nyquist characteristics. Accordingly, the passage is sufficiently inhibited by the Nyquist filter subsequently provided. At the same time, the second term $H[m_3(t)]/2$ is zero in $m_2(t)$-sampling slot t=0, and therefore, both the first and second terms are zero.

Described next is removal of $m_4(t)$ that becomes one of interfering signals.

$$\{H[m_4(t)]\cos\left(\omega_1 - \frac{\omega_0}{2}\right)t + m_4(t)\sin\left(\omega_1 - \frac{\omega_0}{2}\right)t\} \times \sin\left(\omega_1 + \frac{\omega_0}{2}\right)t = \quad (43)$$

$$H[m_4(t)]\cos\left(\omega_1 - \frac{\omega_0}{2}\right)t\sin\left(\omega_1 + \frac{\omega_0}{2}\right)t +$$

$$m_4(t)\sin\left(\omega_1 - \frac{\omega_0}{2}\right)t\sin\left(\omega_1 + \frac{\omega_0}{2}\right)t =$$

$$\frac{1}{2}H[m_4(t)](\sin2\omega_1 t + \sin\omega_0 t) + \frac{1}{2}m_4(t)(\cos2\omega_1 t - \cos\omega_0 t)$$

At this point, passing through the LPF obtains the following equation:

$$\frac{1}{2}H[m_4(t)](\sin2\omega_1 t + \sin\omega_0 t) + \frac{1}{2}m_4(t)(\cos2\omega_1 t - \cos\omega_0 t) \to \quad (44)$$

$$\frac{1}{2}H[m_4(t)]\sin\omega_0 t - \frac{1}{2}m_4(t)\cos\omega_0 t$$

This signal is of lower SSB i.e. LSB with a carrier of frequency $\omega_0$. In other words, the signal has a spectrum that attenuates from the frequency $\omega_0$ to lower frequencies in Nyquist characteristics. Accordingly, vigorous roll-off occurs at frequencies of $\omega_0/2$ or more against the filter having Nyquist characteristics from zero to higher frequencies in the Nyquist filter subsequently provided. Particularly, when the roll-off rate is "0", this signal cannot be passed through the Nyquist filter. Further, as is generally performed, communications are often provided with the strong error correcting function in a subsequent stage to make the bandwidth smaller than the Nyquist bandwidth without setting the roll-off rate at "0", and by applying this technique to this system on a mutatis mutandis basis, passage of signal $m_4(t)$ is sufficiently inhibited.

Next, to obtain information of $m_3(t)$ on the USB, $\cos(\omega_1 - \omega_0/2)t$ is multiplied as expressed in the following equation:

$$s_{SSB-QPSK} \times \cos\left(\omega_1 - \frac{\omega_0}{2}\right)t = \quad (45)$$

$$\{s_{LSB-Re}(t) + s_{LSB-Im}(t) + s_{USB-Re}(t) + s_{USB-Im}(t)\} \times \cos\left(\omega_1 - \frac{\omega_0}{2}\right)t =$$

$$\{m_1(t)\cos\left(\omega_1 + \frac{\omega_0}{2}\right)t + H[m_1(T)]\sin\left(\omega_1 + \frac{\omega_0}{2}\right)t +$$

$$H[m_2(t)]\cos\left(\omega_1 + \frac{\omega_0}{2}\right)t - m_2(t)\sin\left(\omega_1 + \frac{\omega_0}{2}\right)t +$$

$$m_3(t)\cos\left(\omega_1 - \frac{\omega_0}{2}\right)t - H[m_3(T)]\sin\left(\omega_1 - \frac{\omega_0}{2}\right)t + H[m_4(t)]$$

$$\cos\left(\omega_1 - \frac{\omega_0}{2}\right)t + m_4(t)\sin\left(\omega_1 - \frac{\omega_0}{2}\right)t\} \times \cos\left(\omega_1 - \frac{\omega_0}{2}\right)t$$

Described first is removal of $m_1(t)$ that becomes one of interfering signals.

$$\{m_1(t)\cos\left(\omega_1 + \frac{\omega_0}{2}\right)t + H[m_1(T)]\sin\left(\omega_1 + \frac{\omega_0}{2}\right)t\} \times \cos\left(\omega_1 - \frac{\omega_0}{2}\right)t = \quad (46)$$

$$m_1(t)\cos\left(\omega_1 + \frac{\omega_0}{2}\right)t\cos\left(\omega_1 - \frac{\omega_0}{2}\right)t +$$

$$H[m_1(T)]\sin\left(\omega_1 + \frac{\omega_0}{2}\right)t\cos\left(\omega_1 - \frac{\omega_0}{2}\right)t =$$

$$\frac{1}{2}m_1(t)(\cos 2\omega_1 t + \cos \omega_0 t) + \frac{1}{2}H[m_1(T)](\sin \omega_1 t - \sin \omega_0 t)$$

At this point, passing through the LPF obtains the following equation:

$$\frac{1}{2}m_1(t)(\cos 2\omega_1 t + \cos \omega_0 t) + \frac{1}{2}H[m_1(T)](\sin \omega_1 t + \sin \omega_0 t) \rightarrow \quad (47)$$

$$\frac{1}{2}m_1(t)\cos \omega_0 t + \frac{1}{2}H[m_1(T)]\sin \omega_0 t$$

This signal is of lower SSB i.e. LSB with a carrier of frequency $\omega_0$. In other words, the signal has a spectrum that attenuates from the frequency $\omega_0$ to lower frequencies in Nyquist characteristics. Accordingly, vigorous roll-off occurs at frequencies of $\omega_0/2$ or more against the filter having Nyquist characteristics from zero to higher frequencies in the Nyquist filter subsequently provided. Particularly, when the roll-off rate is "0", this signal cannot be passed through the Nyquist filter. Further, as is generally performed, communications are often provided with the strong error correcting function in a subsequent stage to make the bandwidth smaller than the Nyquist bandwidth without setting the roll-off rate at "0", and by applying this technique to this system on a mutatis mutandis basis, passage of signal $m_1(t)$ is sufficiently inhibited.

Described next is removal of $m_2(t)$ that becomes one of interfering signals.

$$\{H[m_2(t)]\cos\left(\omega_1 + \frac{\omega_0}{2}\right)t - m_2(t)\sin\left(\omega_1 + \frac{\omega_0}{2}\right)t\} \times \cos\left(\omega_1 - \frac{\omega_0}{2}\right)t = \quad (48)$$

$$H[m_2(t)]\cos\left(\omega_1 + \frac{\omega_0}{2}\right)t\cos\left(\omega_1 - \frac{\omega_0}{2}\right)t -$$

$$m_2(t)\sin\left(\omega_1 + \frac{\omega_0}{2}\right)t\cos\left(\omega_1 - \frac{\omega_0}{2}\right)t =$$

$$\frac{1}{2}H[m_2(t)](\cos 2\omega_1 t + \cos \omega_0 t) - m_2(t)(\sin 2\omega_1 t + \sin \omega_0 t)$$

At this point, passing through the LPF obtains the following equation:

$$\frac{1}{2}H[m_2(t)](\cos 2\omega_1 t + \cos \omega_0 t) - m_2(t)(\sin 2\omega_1 t + \sin \omega_0 t) \rightarrow \quad (49)$$

$$\frac{1}{2}H[m_2(t)]\cos \omega_0 t - m_2(t)\sin \omega_0 t$$

This signal is of lower SSB i.e. LSB with a carrier of frequency $\omega_0$ in the imaginary domain. In other words, the signal has a spectrum that attenuates from the frequency $\omega_0$ to lower frequencies in Nyquist characteristics. Accordingly, vigorous roll-off occurs at frequencies of $\omega_0/2$ or more against the filter having Nyquist characteristics from zero to higher frequencies in the Nyquist filter subsequently provided. Particularly, when the roll-off rate is "0", this signal cannot be passed through the Nyquist filter. Further, as is generally performed, communications are often provided with the strong error correcting function in a subsequent stage to make the bandwidth smaller than the Nyquist bandwidth without setting the roll-off rate at "0", and by applying this technique to this system on a mutatis mutandis basis, passage of signal $m_2(t)$ is sufficiently inhibited. At the same time, the first term $H[m_2(t)]/2$ is zero in $m_3(t)$-sampling slot $t=0$, and therefore, both the first and second terms are zero.

Described next is $m_3(t)$ to extract.

$$\{m_3(t)\cos\left(\omega_1 - \frac{\omega_0}{2}\right)t + H[m_3(T)]\sin\left(\omega_1 - \frac{\omega_0}{2}\right)t\} \times \cos\left(\omega_1 - \frac{\omega_0}{2}\right)t = \quad (50)$$

$$m_3(t)\cos^2\left(\omega_1 - \frac{\omega_0}{2}\right)t + H[m_3(T)]\sin\left(\omega_1 - \frac{\omega_0}{2}\right)t \times \cos\left(\omega_1 + \frac{\omega_0}{2}\right)t =$$

$$\frac{1}{2}m_3(t)\{1 + \cos 2\left(\omega_1 - \frac{\omega_0}{2}\right)t\} + \frac{1}{2}H[m_3(T)]\sin 2\left(\omega_1 - \frac{\omega_0}{2}\right)t$$

At this point, passing through the LPF obtains the following equation:

$$\frac{1}{2}m_3(t)\{1 + \cos 2\left(\omega_1 - \frac{\omega_0}{2}\right)t\} + \frac{1}{2}H[m_3(T)]\sin 2\left(\omega_1 - \frac{\omega_0}{2}\right)t \rightarrow \frac{1}{2}m_3(t) \quad (51)$$

$m_3(t)$ is thus extracted.

Described next is removal of $m_4(t)$ that becomes one of interfering signals.

$$\{H[m_4(t)]\cos\left(\omega_1 - \frac{\omega_0}{2}\right)t - m_4(t)\sin\left(\omega_1 - \frac{\omega_0}{2}\right)t\} \times \cos\left(\omega_1 - \frac{\omega_0}{2}\right)t = \quad (52)$$

$$H[m_4(t)]\cos^2\left(\omega_1 - \frac{\omega_0}{2}\right)t - m_4(t)\sin\left(\omega_1 - \frac{\omega_0}{2}\right)t\cos\left(\omega_1 - \frac{\omega_0}{2}\right)t =$$

$$\frac{1}{2}H[m_4(t)]\{1 + \cos 2\left(\omega_1 - \frac{\omega_0}{2}\right)t\} - \frac{1}{2}m_4(t)\sin 2\left(\omega_1 - \frac{\omega_0}{2}\right)t$$

At this point, passing through the LPF obtains the following equation:

$$\frac{1}{2}H[m_4(t)]\{1+\cos2(\omega_1-\frac{\omega_0}{2})t\}-\frac{1}{2}m_4(t)\sin2(\omega_1-\frac{\omega_0}{2})t \rightarrow \quad (53)$$

$$\frac{1}{2}H[m_4(t)]$$

This signal is orthogonal to $m_3(t)$, and therefore, is zero in t=0 that is of sampling slot of $m_3(t)$.

Next, to obtain information $m_4(t)$ on the LSB, $\sin(\omega_1-\omega_0/2)t$ is multiplied as expressed in the following equation:

$$s_{SSB-QPSK} \times \sin(\omega_1-\frac{\omega_0}{2})t = \quad (54)$$

$$\{s_{LSB-Re}(t)+s_{LSB-Im}(t)+s_{USB-Re}(t)+s_{USB-Im}(t)\} \times \sin(\omega_1-\frac{\omega_0}{2})t =$$

$$\{m_1(t)\cos(\omega_1\frac{\omega_0}{2})t+H[m_1(T)]\sin(\omega_1+\frac{\omega_0}{2})t+$$

$$H[m_2(t)]\cos(\omega_1+\frac{\omega_0}{2})t-m_2(t)\sin(\omega_1+\frac{\omega_0}{2})t+$$

$$m_3(t)\cos(\omega_1-\frac{\omega_0}{2})t-H[m_3(T)]\sin(\omega_1-\frac{\omega_0}{2})t+H[m_4(t)]$$

$$\cos(\omega_1-\frac{\omega_0}{2})t+m_4(t)\sin(\omega_1-\frac{\omega_0}{2})t\} \times \sin(\omega_1-\frac{\omega_0}{2})t$$

Described first is elimination of $m_1(t)$.

$$\{m_1(t)\cos(\omega_1+\frac{\omega_0}{2})t+H[m_1(T)]\sin(\omega_1+\frac{\omega_0}{2})t\} \times \sin(\omega_1-\frac{\omega_0}{2})t = \quad (55)$$

$$m_1(t)\cos(\omega_1+\frac{\omega_0}{2})t\sin(\omega_1-\frac{\omega_0}{2})t+$$

$$H[m_1(T)]\sin(\omega_1+\frac{\omega_0}{2})t\sin(\omega_1-\frac{\omega_0}{2})t =$$

$$\frac{1}{2}m_1(t)(\sin2\omega_1 t-\sin\omega_0 t)+\frac{1}{2}H[m_1(T)](\cos2\omega_1 t-\cos\omega_0 t)$$

At this point, passing through the LPF obtains the following equation:

$$\frac{1}{2}m_1(t)(\sin2\omega_1 t-\sin\omega_0 t)+\frac{1}{2}H[m_1(T)](\cos2\omega_1 t-\cos\omega_0 t) \rightarrow \quad (56)$$

$$-\frac{1}{2}m_1(t)\sin\omega_0 t-\frac{1}{2}H[m_1(T)]\cos\omega_0 t$$

This signal is of upper SSB i.e. USB with a carrier of frequency $\omega_0$ in the imaginary domain. In other words, the signal has a spectrum that attenuates from the frequency $\omega_0$ to higher frequencies in Nyquist characteristics. Accordingly, the passage is sufficiently inhibited by the Nyquist filter subsequently provided. At the same time, the second term $H[m_1(t)]/2$ is zero in $m_4(t)$-sampling slot t=0, and therefore, both the first and second terms are zero.

Next, for elimination of $m_2(t)$, the equation is expanded as expressed in the following equation:

$$\{H[m_2(t)]\cos(\omega_1+\frac{\omega_0}{2})t-m_2(t)\sin(\omega_1+\frac{\omega_0}{2})t\} \times \sin(\omega_1-\frac{\omega_0}{2})t = \quad (57)$$

$$H[m_2(t)]\cos(\omega_1+\frac{\omega_0}{2})t\sin(\omega_1-\frac{\omega_0}{2})t+$$

$$m_2(t)\sin(\omega_1+\frac{\omega_0}{2})t\sin(\omega_1-\frac{\omega_0}{2})t =$$

$$\frac{1}{2}H[m_2(t)](\sin2\omega_1 t-\sin\omega_0 t)-\frac{1}{2}m_2(t)(\cos2\omega_1 t-\cos\omega_0 t)$$

At this point, passing through the LPF obtains the following equation:

$$\frac{1}{2}H[m_2(t)](\sin2\omega_1 t-\sin\omega_0 t)-\frac{1}{2}m_2(t)(\cos2\omega_1 t-\cos\omega_0 t) \rightarrow \quad (58)$$

$$-\frac{1}{2}H[m_2(t)]\sin2\omega_0 t+\frac{1}{2}m_2(t)\cos\omega_0 t$$

This signal is of upper SSB i.e. USB with a carrier of frequency $\omega_0$. In other words, the signal has a spectrum that attenuates from the frequency $\omega_0$ to higher frequencies in Nyquist characteristics. Accordingly, the passage is sufficiently inhibited by the Nyquist filter subsequently provided.

Described next is removal of $m_3(t)$ that becomes one of interfering signals.

$$\{m_3(t)\cos(\omega_1+\frac{\omega_0}{2})t-H[m_3(T)]\sin(\omega_1+\frac{\omega_0}{2})t\} \times \sin(\omega_1-\frac{\omega_0}{2})t = \quad (59)$$

$$m_3(t)\cos(\omega_1+\frac{\omega_0}{2})t\sin(\omega_1-\frac{\omega_0}{2})t-H[m_3(T)]\sin^2(\omega_1-\frac{\omega_0}{2})t =$$

$$\frac{1}{2}m_3(t)\sin2(\omega_1-\frac{\omega_0}{2})t-\frac{1}{2}H[m_3(T)](1-\sin2(\omega_1-\frac{\omega_0}{2}))$$

At this point, passing through the LPF obtains the following equation:

$$\frac{1}{2}m_3(t)\sin2(\omega_1-\frac{\omega_0}{2})t-\frac{1}{2}H[m_3(T)](1-\sin2(\omega_1-\frac{\omega_0}{2})) \rightarrow \quad (60)$$

$$-\frac{1}{2}H[m_3(T)]$$

This signal is orthogonal to $m_4(t)$, and therefore, is zero in t=0 that is of sampling slot of $m_4(t)$.

Described next is extraction of $m_4(t)$.

$$\{H[m_4(t)]\cos(\omega_1-\frac{\omega_0}{2})t+m_4(t)\sin(\omega_1-\frac{\omega_0}{2})t\} \times \sin(\omega_1-\frac{\omega_0}{2})t = \quad (61)$$

$$H[m_4(t)]\cos(\omega_1-\frac{\omega_0}{2})t\sin(\omega_1-\frac{\omega_0}{2})t+m_4(t)^2\sin(\omega_1-\frac{\omega_0}{2})t =$$

$$\frac{1}{2}H[m_4(t)]\sin2(\omega_1-\frac{\omega_0}{2})t+\frac{1}{2}m_4(t)\{1-\sin2(\omega_1-\frac{\omega_0}{2})t\}$$

At this point, passing through the LPF obtains the following equation:

$$\frac{1}{2}H[m_4(t)]\sin2(\omega_1-\frac{\omega_0}{2})t+\frac{1}{2}m_4(t)\{1-\sin2(\omega_1-\frac{\omega_0}{2})t\} \rightarrow \frac{1}{2}m_4(t) \quad (62)$$

Thus, extraction of $m_4(t)$ can be performed.

With the foregoing considered, in SSB signal group $s_{SSB-QPSK}=s_{LSB-Re}(t)+s_{LSB-Im}(t)+s_{USB-Re}(t)+s_{USB-Im}(t)$ obtained by multiplexing signals $m_1(t)$, $m_2(t)$, $m_3(t)$ and $m_4(t)$, to extract signal $m_1(t)$, it is possible to remove high-frequency unnecessary components with the LPF multiplied by $\cos(\omega_1+\omega_0/2)t$ and extract the signal at sampling time t=0.

Similarly, it is possible to extract signal $m_2(t)$ by detection with sin $(\omega_1+\omega_0/2)t$, signal $m_3(t)$ by detection with cos$(\omega_1-\omega_0/2)t$, and signal $m_4(t)$ by detection with sin $(\omega_1-\omega_0/2)t$.

Embodiment 3

The purely analog-based demodulation scheme as described in Embodiment 2 largely depends on the roll-off rate and roll-off filter, and this method does not eliminate completely the inclusion of interfering components in a demodulated signal.

As can be seen from the spectrum in reception, the modulation scheme in Embodiment 2 provides a side band at the precisely same position as in the spectral configuration in OFDM.

By focusing attention on this respect, the inventors of the present invention found out that overlapping adjacent spectra can be completely eliminated by Fourier transform means.

This Embodiment proposes a demodulation scheme different from the demodulation scheme in Embodiment 2 on the model in the spectral configuration in Embodiment 2.

Figure 21:
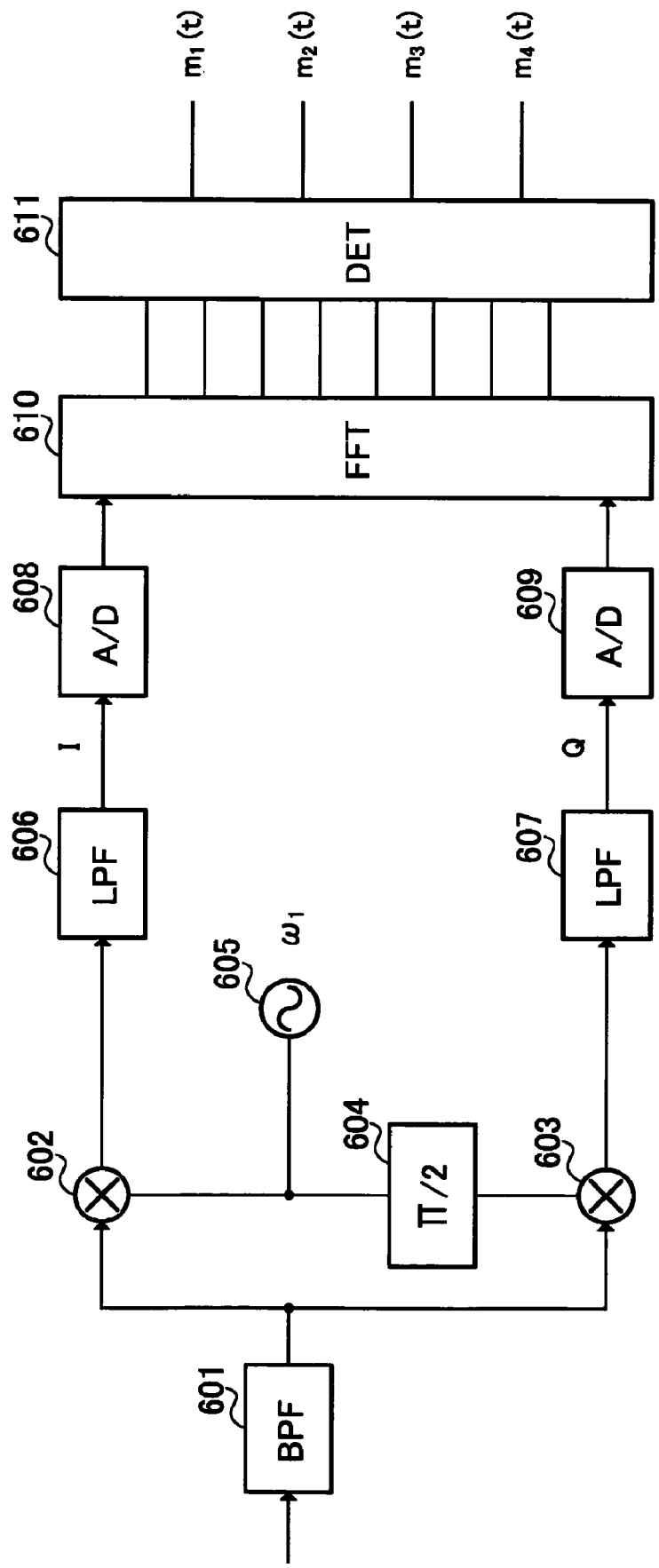
FIG. 21 is a block diagram illustrating a configuration of a demodulation apparatus of Embodiment 3.

FIG. 21 illustrates a configuration of demodulation apparatus 600 of this Embodiment.

A received signal is input to band-pass filter (BPF) 601 in demodulation apparatus 600. The received signal with a necessary bandwidth only passed through BPF 601 is input to a quadrature detector comprised of frequency signal source 605 that generates carrier frequency $\omega_1$, multipliers 602 and 603, and $\pi/2$ shifter 604.

The received signal is thereby detected with the LSB-carrier frequency in the quadrature detector. The quadrature-detected signals are input to analog/digital converters (A/D) 608 and 609 via low-pass filters (LPF) 606 and 607, respectively.

The signals quantized in analog/digital converters (A/D) 608 and 609 are subjected to Fourier transform in fast Fourier transform (FFT) circuit 610, and then, input to signal detector (DET(DETector)) 611. Then, signal detector 611 detects original signals $m_1(t)$, $m_2(t)$, $m_3(t)$ and $m_4(t)$.

Figures 22A, 22B, 22C:
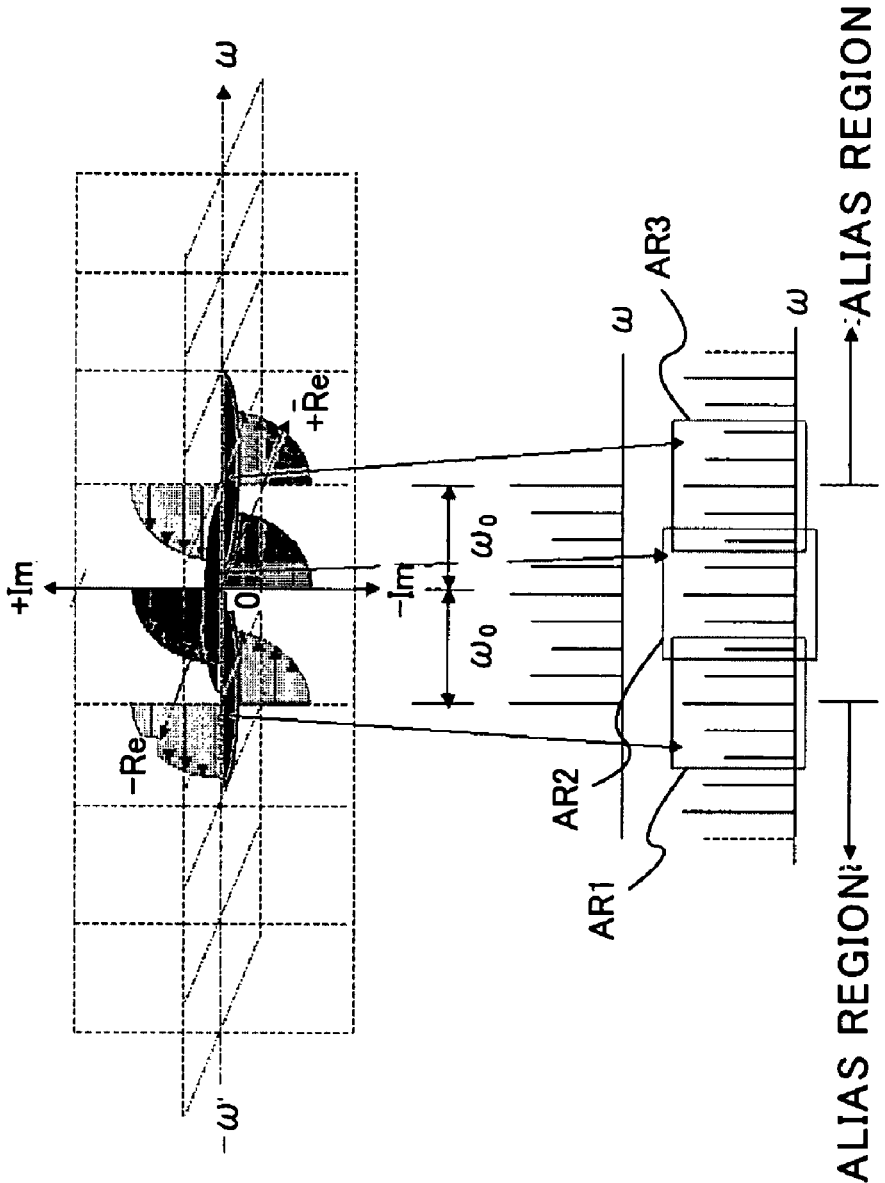
FIG. 22A is a diagram illustrating baseband spectra in detection with carrier-frequency cosine curve of the LSB.
FIG. 22B is a diagram illustrating the concept of FFT output.
FIG. 22C is a diagram illustrating an actual FFT output including aliases.

FIGS. 22B and 22C illustrate spectra of the signal lowered to the baseband band in low-pass filter (LPF) 607. FIGS. 22A to 22C show the spectral configuration of detection output (output of multiplier 603) on the cosine curve side. More specifically, the figures show the baseband spectra and FFT output in the case of (output of multiplier 603) detection with the cosine curve with the carrier frequency of the LSB. The real frequency plane is the horizontal plane, while the imaginary frequency plane (with delay of $\pi/2$) is the vertical plane, in the drawings. In addition, FIG. 22A shows the baseband spectra in the case of (output of multiplier 603) detection with the carrier frequency of the LSB, FIG. 22B shows the concept of their FFT output, and FIG. 22C shows the actual FFT output including aliases.

As described above, the output signal from low-pass filter (LPF) 607 is quantized in analog/digital converter (A/D) 609, and then, input to FFT circuit 610.

At this point, the over-sampling frequency in analog/digital converter (A/D) 609 is made at least twice as much as that of the baseband entire bandwidth. In general OFDM, the over-sampling frequency is only of a factor of the number of central lines of subcarriers. In this scheme, to take advantage of the Nyquist's vestigial symmetry theorem, over-sampling is performed in a frequency at least twice as much as that in OFDM. In this Embodiment, the sampling is performed at a rate of four times or more. In the example as shown in FIGS. 22A to 22C, the sampling is performed at the 4-times rate.

As a result, signal amplitude is obtained from FFT circuit 610 corresponding to positions in FIG. 22B, but actually discrete, aliases are thereby generated, and it is possible to obtain the output as shown in FIG. 22C.

The signal group AR1 in FIG. 22C is the signal $m_3(t)$ modulated with the upper side band real part. The signal group AR2 is the signal $m_1(t)$ modulated with the lower side band real part. The signal group AR3 is equal to the signal group AR1, and considered an alias.

In other words, the signal $m_1(t)$ and signal $m_3(t)$ become both sides signals, and are divided by matrix manipulation effect of FFT irrespective of the overlapping spectra. Further, according to the Nyquist's vestigial symmetry theorem, for example, in the case of the roll-off rate of 0.5, spectra on both sides of the central spectrum become completely own information.

Figures 23A, 23B, 23C:
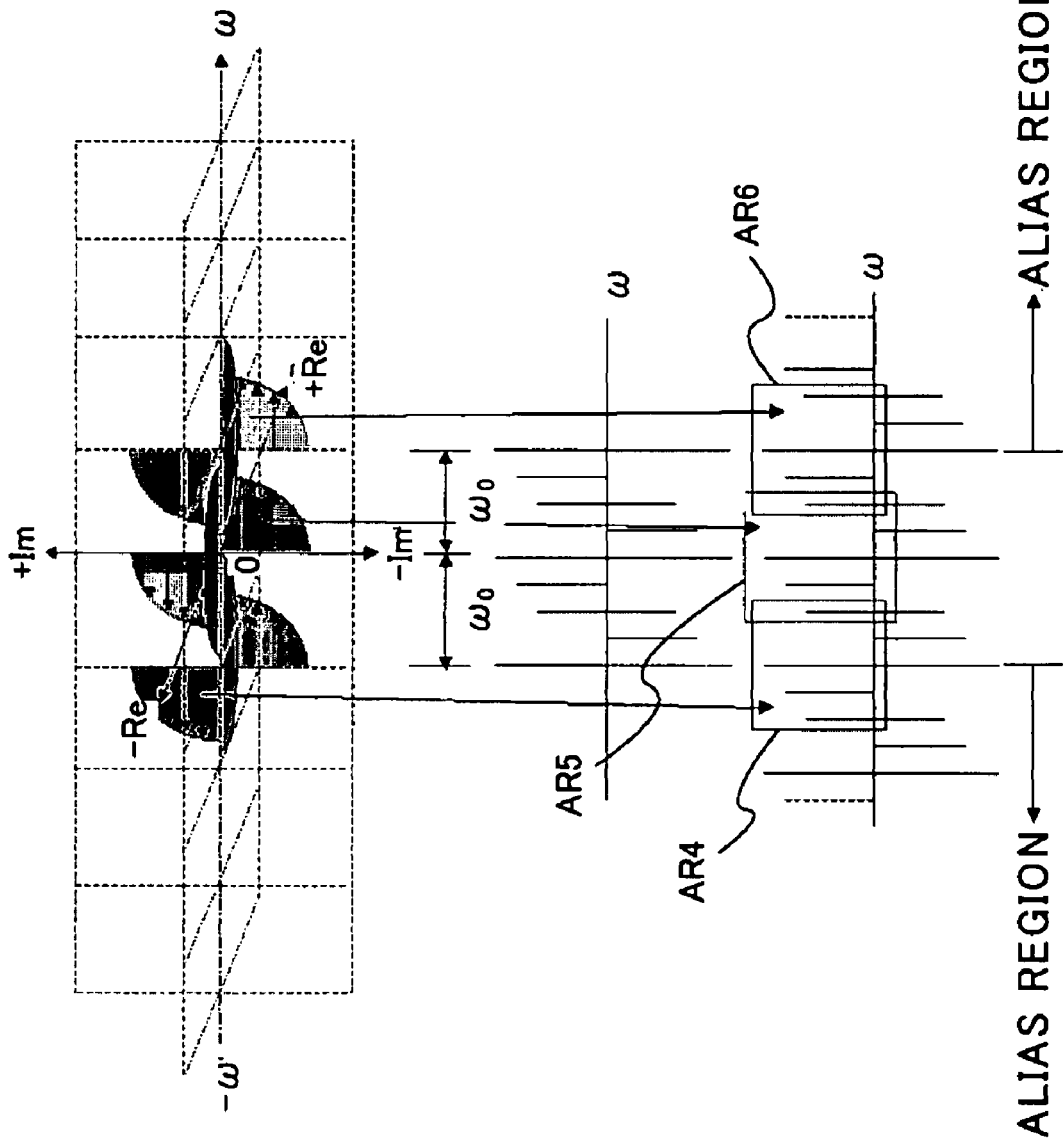
FIG. 23A is a diagram illustrating baseband spectra in detection with carrier-frequency sine curve of the LSB.
FIG. 23B is a diagram illustrating the concept of FFT output.
FIG. 23C is a diagram illustrating an actual FFT output including aliases.

FIGS. 23A to 23C show the spectral configuration of detection output (output of multiplier 602) on the sine curve side. More specifically, the figures show the baseband spectra and FFT output in the case of (output of multiplier 602) detection with the sine curve with the carrier frequency of the LSB. The real frequency plane is the horizontal plane, while the imaginary frequency plane (with delay of $\pi/2$) is the vertical plane, in the drawings. In addition, FIG. 23A shows the baseband spectra in the case of (output of multiplier 602) detection with the carrier frequency of the LSB, FIG. 23B shows the concept of their FFT output, and FIG. 23C shows the actual FFT output including aliases.

As described above, the output signal from low-pass filter (LPF) 606 is quantized in analog/digital converter (A/D) 608, and then, input to FFT circuit 610. Also in analog/digital converter (A/D) 608, as in analog/digital converter (A/D) 609, the over-sampling frequency is set at least twice as much as the entire baseband bandwidth.

In this Embodiment, the sampling is performed in the sampling frequency of four times or more. In FIGS. 23A to 23C, as in FIGS. 22A to 22C, the sampling is performed at the 4-times rate.

As a result, signal amplitude is obtained from FFT circuit 610 corresponding to positions in FIG. 23B, but actually discrete, aliases are thereby generated, and it is possible to obtain the output as shown in FIG. 23C.

The signal group AR4 in FIG. 23C is the signal $m_4(t)$ modulated with the upper side band imaginary part. The signal group AR5 is the signal $m_3(t)$ modulated with the lower side band real part. The signal group AR6 is equal to the signal group AR4, and considered an alias. In addition, when the quadrature detector performs detection with the sine curve, FIGS. 23B and 23C are of even-symmetric signals.

Extraction of a signal in FFT circuit 610 will be described below by equation.

Target signals are to be accommodated in a finite limited band, and regarded as being comprised of only a finite number (2M+1) of frequency components. In this case, the SSB multiplexed signal can be assumed to be a periodic functions (t) with the symbol duration as period T. Expressing the periodical function s(t) by complex Fourier series is as in the following equation:

$$s(t) = \sum_{k=-M}^{M} c_k e^{jk\omega_0 t} \qquad (63)$$

Further, sampling N divisions in one-period T of s(t) results in the discrete expression as in the following equation:

$$s(mT/N) = \sum_{k=-M}^{M} c_k e^{jk\omega_0 mT/N} \tag{64}$$

Substituting $\omega_0=2\pi/T$ into the above equation provides the following equation without control of $\omega_0$:

$$s(mT/N) = \sum_{k=-M}^{M} c_k e^{j2\pi km/N} \tag{65}$$

Further, assuming that the number of spectra for the width $\omega_0$ after performing Fourier Transform is n results in the expression as in the following equation:

$$s(mT/N) = \sum_{n=0}^{N-1} c_k e^{j2\pi nm/N} \sum_{r=-M}^{M} c_{n+rN} \tag{66}$$

It is understood that the equation indicates N-order linear simultaneous equations.

Fourier transform of a finite number of time signal sample values is defined by the following equation:

$$S(k) = \sum_{n=0}^{N-1} s(n) e^{-j2\pi kmn/N} \tag{67}$$

The equation is expressed as a matrix as in the following equation:

$$\begin{bmatrix} 1 & 1 & \cdots & 1 \\ 1 & e^{-j2\pi/N} & \cdots & e^{-j2\pi(N-1)/N} \\ \vdots & \vdots & \cdots & \vdots \\ 1 & e^{-j\pi(N-1)/N} & \cdots & e^{-j2\pi(N-1)(N-1)/N} \end{bmatrix} \begin{bmatrix} s_0 \\ s_1 \\ \vdots \\ s_{N-1} \end{bmatrix} = \begin{bmatrix} S_0 \\ S_1 \\ \vdots \\ S_{N-1} \end{bmatrix} \tag{68}$$

The matrix can be solved by multiplying $e^{j2\pi kn/N}$ (k=0, 1, 2, ..., N−1) by both sides to add up as expressed in the following equation:

$$\begin{bmatrix} 1 & 1 & \cdots & 1 \\ e^{j2\pi n/N} & e^{-j2\pi/N}e^{j2\pi n/N} & \cdots & e^{-j2\pi n/N}e^{j2\pi n/N} \\ \vdots & \vdots & \cdots & \vdots \\ 1 & e^{j2\pi(N-1)n/N} & \cdots & e^{-j2\pi n(N-1)/N}e^{j2\pi(N-1)/N} \end{bmatrix} \tag{69}$$

$$\begin{bmatrix} s_0 \\ s_1 \\ \vdots \\ s_{N-1} \end{bmatrix} = \begin{bmatrix} S_0 \\ S_1 e^{j2\pi n/N} \\ \vdots \\ S_{N-1} e^{j2\pi(N-1)n/N} \end{bmatrix}$$

By the above equation, the solutions are all zero except the nth column, and the exponent part of each term is zero in the nth column. Accordingly, the sum of the nth column is $Ns_n$.

Here, $s_n$ i.e. s(n) is a complex signal, and expressed in the following equation:

$$s(n) = s_{re}(n) + js_{im}(n) \tag{70}$$

At this point, Fourier transform S(k) of s(n) is expressed as in the following equation from Eq. (67):

$$S(k) = S_k \tag{71}$$

$$= \sum_{n=0}^{N-1} \{s_{re}(n) + js_{im}(n)\} e^{-j2\pi kn/N}$$

$$= \sum_{n=0}^{N-1} \{s_{re}(n) + js_{im}(n)\}(\cos(2\pi nk/N) - j\sin(2\pi nk/N))$$

$$= \sum_{n=0}^{N-1} [s_{re}(n)\cos(2\pi nk/N) + s_{im}(n)\sin(2\pi nk/N) +$$

$$j\{s_{im}(n)\cos(2\pi nk/N) - s_{re}(n)\sin(2\pi nk/N)\}]$$

Assuming that a real part of S(k) is $S_{re}(k)$ and $S_{im}(k)$, the items are expressed as in the following equations:

$$S_{im}(k) = \sum_{n=0}^{N-1} \{-s_{re}(n)\sin(2\pi nk/N) + s_{im}(n)\cos(2\pi nk/N)\} \tag{72}$$

$$S_{re}(k) = \sum_{n=0}^{N-1} \{s_{re}(n)\cos(2\pi nk/N) + s_{im}(n)\sin(2\pi nk/N)\} \tag{73}$$

The whole of this scheme is comprised of SSB i.e. analytic signals i.e. signals rotating in one direction, positive or negative direction, in phase space on the time axis. Particularly, the scheme comprised of signals based on the Nyquist symmetry principle guarantees rotation of its signal in the Nyquist bandwidth with reliability.

To take advantage of such a characteristic, in the scheme, signal detector (DET) 611 takes a logical product of a signal in each carrier frequency and a signal in the adjacent frequency on the USB or LSB side.

Figure 24:
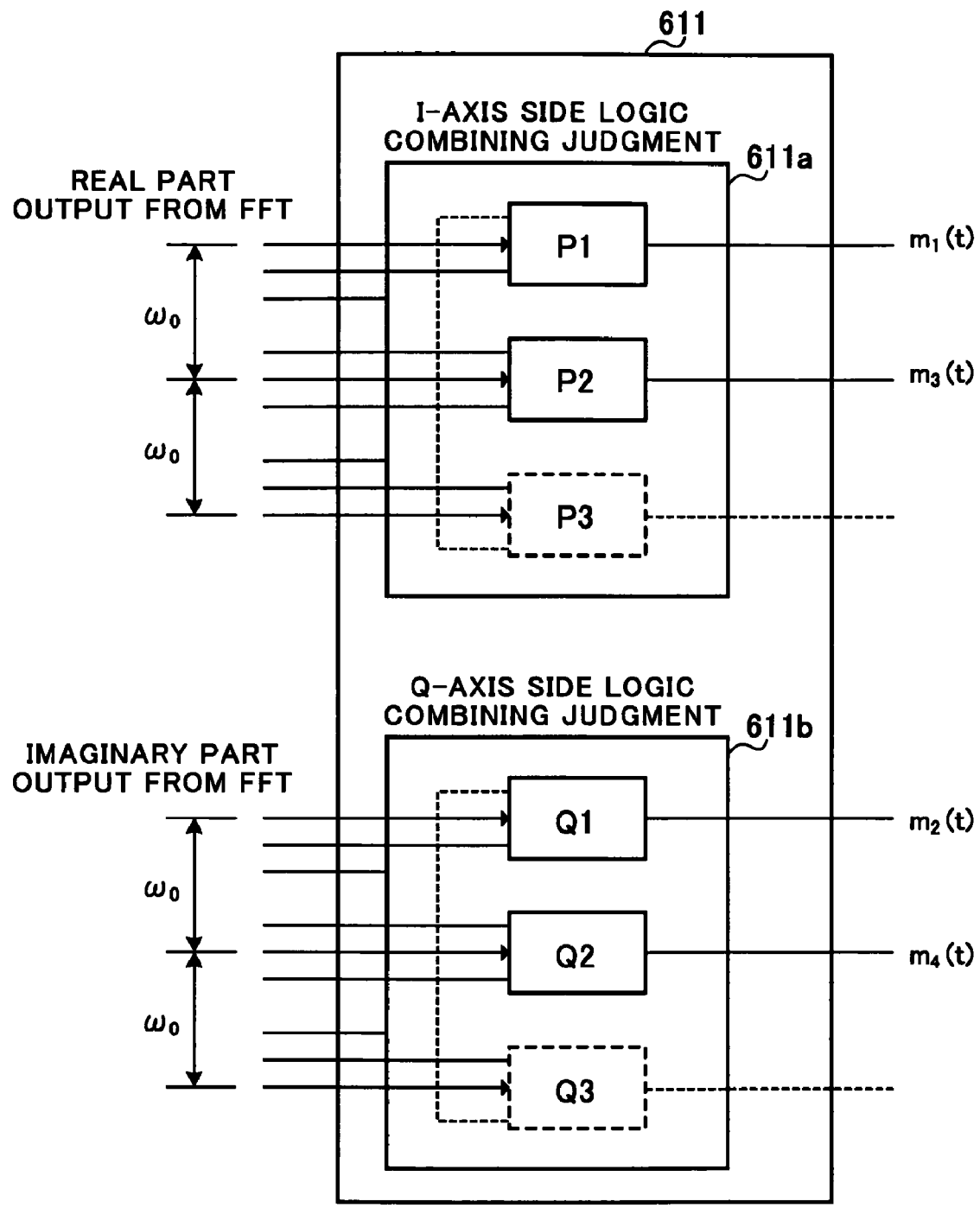
FIG. 24 is a diagram illustrating a principle configuration of a DET (detector).

FIG. 24 shows a model of signal detector (DET) 611. Signal detector (DET) 611 compares output data at a position of each carrier frequency as a center with logic of higher or lower data to judge a signal. The I-axis side component and Q-axis side component are present in the same frequencies, and become an even function when output from the quadrature detection. Signal detector (DET) 611 in FIG. 24 judges the function, and separates the interfering side i.e. an odd function component.

This principle will be described below more specifically, including characteristics of a modulation signal of the invention.

As described above, FIG. 22A illustrates a modulation signal to be demodulated in demodulation apparatus 600 in this Embodiment. More specifically, the modulation signal is comprised of four types of signals in the SSB scheme, and FIG. 22A shows a state where the signals are configured in complex frequency space. The modulation signal is transmitted on a radio path with this state maintained and reaches the reception side.

When the Nyquist roll-off rate α is set at "0" in the modulation system, spectra of the USB side and LSB side do not overlap. As the Nyquist roll-off rate α approaches "1", broadband components of the USB and LSB overlap.

Upon receiving the signal as shown in FIG. 22A, demodulation apparatus 600 digitizes the signal by sampling at a short sampling period one-fourth or more the symbol duration.

When the sampling period is one-fourth the symbol duration and the digitized data is input to FET circuit 610, such an output is obtained that has frequency spectra at positions obtained by dividing the symbol duration in quarters as shown in FIG. 22B.

Of the spectrum at each position of the quarters, when the Nyquist roll-off rate α is zero, two spectra in lower frequencies are of USB, and two spectra in higher frequencies are of LSB. The spectrum at the middle position is zero. However, when the Nyquist roll-off rate α is not zero, slight crosstalk occurs, and the component of LSB intrudes into the spectra in the lower frequencies, while the component of USB intrudes into the spectral in the higher frequencies.

However, according to the Nyquist's vestigial symmetry theorem, an amount of the spectrum intruding into the other side can be estimated readily from an amount of the spectrum on one side.

Signal detector (DET) 611 corrects the amount of the spectrum intruding into the other side to remove, and thus fetches the USB signal and LSB signal without interference. At the same time, signal detector (DET) 611 divides each of the USB and LSB that are complex signals into the real part and imaginary part, thereby restores the information signal that is modulated complex-orthogonally and independently on the modulation side to the original signal, and thus completes demodulation. In other words, signal detector (DET) 611 separates the real component and imaginary component from a complex SSB signal.

FIG. 22C shows an idea of using generation of alias in sampling. When a signal lowered to the baseband signal band on the reception side is sampled in a period one-fourth the symbol frequency as, described above, spectra are generated in the baseband band, and at the same time, alias components are generated on both the lower and higher sides.

As well as the method of obtaining a final baseband signal using only frequency components indicated by FFT output, it is possible to directly reproduce an original symbol signal by using the aliases to transform the SSB signal to the DSB (Double Side Band) signal.

The DSB signal requires signals that are symmetric on the lower and higher frequencies sides with respect to a central frequency as an axis. FIG. 22B shows only a sampling result in band-limited sampling, and the DSB signal cannot be obtained. As the alias effect in sampling, spectral components obtained between the USB carrier and LSB carrier are parallel-shifted on the frequency axis to lower or higher frequencies to be copied, and it is thereby possible to obtain spectral components symmetric in lower-higher frequencies with a respective carrier as an axis in lower frequencies than the USB carrier and in higher frequencies than the LSB carrier. This state is DSB i.e. of original information signal components.

FIG. 24 shows the model of signal detector (DET) 611 to generate a DSB signal using the aliases. A band-limited received signal provides only limited spectra, but it is indicated that by parallel-shifting (using aliases), a signal group of DSB can be obtained.

In FIG. 24, P1 and P2 represent DSB block 611a that extracts information of the LSB and USB on the real-axis side. P3 represents aliases of P1. It is indicated that a signal of upper end or lower end of the FFT output overlaps part of signals of P1 and P3. Accordingly, substituting an output of P3 for an output of P1 obtains the same result.

Similarly, DSB block 611b that extracts information on the imaginary-axis side is indicated by Q1, Q2 and Q3. The reason why part of input signals of Q1 and Q3 overlap is the same as the reason described on P1 and P3. Accordingly, Q1 or Q3 is DSB corresponding to LSB, while Q2 is DSB corresponding to USB.

From the foregoing, it is understood that an information amount twice as much as that in OFDM can be received and demodulated in the system that enhances to some extent FFT used in the general OFDM demodulation circuit.

The present invention is not limited to the above-mentioned Embodiments, and is capable of being carried into practice with various modifications thereof.

As described above, according to the present invention, it is possible to implement a modulation apparatus enabling great improvements in signal transmission rate as compared with a conventional quadrature modulation scheme in a range of frequency bandwidth required for the conventional quadrature modulation scheme with a simple circuit configuration, and to implement a demodulation apparatus enabling a modulation signal from the modulation apparatus to be demodulated with excellence.

This application is based on the Japanese Patent Applications No. 2003-280519 filed on Jul. 25, 2003, No. 2003-382324 filed on Nov. 12, 2003, and No. 2004-151056 filed on Apr. 19, 2004, entire contents of which are expressly incorporated by reference herein.

INDUSTRIAL APPLICABILITY

The present invention relates to a new modulation scheme to improve the spectral efficiency in radio communications, and is applicable widely to radio communication apparatuses used in, for example, mobile communications, wireless LAN (Local Area Network) and the like requiring high-speed signal transmission in a limited frequency band.

The invention claimed is:

1. A modulation apparatus comprising:
a first frequency-increasing single side band (SSB) modulator that performs SSB modulation on a first input symbol to obtain an upper side band (USB) signal;
a second frequency-increasing SSB modulator that performs the SSB modulation on a second input symbol to obtain a lower side band (LSB) signal; and
a combiner that combines the USB signal and the LSB signal,
wherein the second frequency-increasing SSB modulator performs SSB modulation to obtain the LSB signal using a carrier frequency, the carrier frequency being higher than a carrier frequency used in the first frequency-increasing SSB modulator by a symbol frequency of the first input symbol and the second input symbol, such that the LSB signal and the USB signal are multiplexed in the same frequency band,
wherein the first frequency-increasing SSB modulator comprises a first Hilbert transformer and obtains the USB signal by multiplying a signal output from the first Hilbert transformer by a signal comprising a sine curve with a frequency $(\omega_{1(first)} - \omega_{0(first)}/2)$,
wherein the second frequency-increasing SSB modulator comprises a second Hilbert transformer and obtains the LSB signal by multiplying a signal output from the second Hilbert transformer by a signal comprising a sine curve with a frequency $(\omega_{1(second)} + \omega_{0(second)}/2)$, and
wherein $\omega_{0(first)}$ is the symbol frequency of the first input symbol, $\omega_{0(second)}$ is the symbol frequency of the second input symbol, $\omega_{1(first)}$ is the carrier frequency used in the first frequency-increasing SSB modulator, and $\omega_{1(second)}$ is the carrier frequency used in the second frequency-increasing SSB modulator.

2. A demodulation apparatus for demodulating a signal combined by the combiner in the modulation apparatus according to claim 1, the demodulation apparatus comprising:
- a first frequency-decreasing demodulator that demodulates an input modulation signal by a cosine curve with a first carrier frequency to obtain a first demodulation signal; and
- a second frequency-decreasing demodulator that demodulates the input modulation signal by a sine curve with a second carrier frequency to obtain a second demodulation signal, wherein
- the second carrier frequency is higher than the first carrier frequency by the symbol frequency of the first input symbol and the second input symbol.

3. The modulation apparatus of claim 1, wherein the symbol frequency of the first and second input symbols is the bandwidth of each of the first and second input symbols.

4. The modulation apparatus of claim 3, wherein the frequency band into which the LSB and USB signals are both multiplexed has the same bandwidth as each of the first and second input symbols.

5. A modulation method comprising:
- an upper side band (USB) signal forming step of performing single side band (SSB) modulation on a first input symbol to obtain a USB signal;
- a lower side band (LSB) signal forming step of performing the SSB modulation on a second input symbol to obtain an LSB signal; and
- a combining step of combining the USB signal and the LSB signal,
- wherein, in the LSB signal forming step, the SSB modulation is performed using a carrier frequency, the carrier frequency being higher than a carrier frequency used in the USB signal forming step by a symbol frequency of the first input symbol and the second input symbol, such that the LSB signal and the USB signal are multiplexed in the same frequency band,
- wherein the USB signal forming step comprises obtaining the USB signal by multiplying a signal output from a first Hilbert transformer by a signal comprising a sine curve with a frequency $(\omega_{1(first)}-\omega_{0(first)}/2)$,
- wherein the LSB signal forming step comprises obtaining the LSB signal by multiplying a signal output from a second Hilbert transformer by a signal comprising a sine curve with a frequency $(\omega_{1(second)}-\omega_{0(second)}/2)$, and
- wherein $\omega_{0(first)}$ is the symbol frequency of the first input symbol, $\omega_{0(second)}$ is the symbol frequency of the second input symbol, $\omega_{1(first)}$ is the carrier frequency used in the USB signal forming step, and $\omega_{1(second)}$ is the carrier frequency used in the LSB signal forming step.

6. A demodulation method of demodulating a signal combined in the combining step of the modulation method according to claim 5, the method comprising:
- a first demodulation step of demodulating a modulation signal by a cosine curve with a first carrier frequency to obtain a first demodulation signal; and
- a second demodulation step of demodulating the modulation signal by a sine curve with a second carrier frequency to obtain a second demodulation signal, wherein
- the second carrier frequency is higher than the first carrier frequency by the symbol frequency of the first input symbol and the second input symbol.

7. The modulation method of claim 5, wherein the symbol frequency of the first and second input symbols is the bandwidth of each of the first and second input symbols.

8. The modulation method of claim 7, wherein the frequency band into which the LSB and USB signals are both multiplexed has the same bandwidth as each of the first and second input symbols.

* * * * *